(12) United States Patent
Pyo et al.

(10) Patent No.: US 11,594,187 B2
(45) Date of Patent: Feb. 28, 2023

(54) DISPLAY DEVICE AND METHOD OF DRIVING THE SAME

(71) Applicant: Samsung Display Co., Ltd., Yongin-si (KR)

(72) Inventors: Si Beak Pyo, Yongin-si (KR); Yeong Bong Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 16 days.

(21) Appl. No.: 17/248,903

(22) Filed: Feb. 12, 2021

(65) Prior Publication Data

US 2021/0343247 A1 Nov. 4, 2021

(30) Foreign Application Priority Data

Apr. 29, 2020 (KR) .......................... 10-2020-0052779

(51) Int. Cl.
*G09G 3/3291* (2016.01)
*G09G 3/3225* (2016.01)
*H01L 27/32* (2006.01)

(52) U.S. Cl.
CPC ......... *G09G 3/3291* (2013.01); *G09G 3/3225* (2013.01); *H01L 27/3216* (2013.01); *G09G 2300/0452* (2013.01); *G09G 2320/0626* (2013.01); *G09G 2320/0673* (2013.01); *G09G 2360/147* (2013.01)

(58) Field of Classification Search
CPC .................. H01L 27/3216; H01L 27/3227
See application file for complete search history.

(56) References Cited

U.S. PATENT DOCUMENTS

| | | | |
|---|---|---|---|
| 9,666,116 B2 * | 5/2017 | Jung | G09G 3/2003 |
| 2007/0252782 A1 | 11/2007 | Yui | |
| 2014/0097760 A1 * | 4/2014 | Kato | H05B 45/00 |
| | | | 315/192 |
| 2014/0146097 A1 * | 5/2014 | Kimura | G09G 3/3648 |
| | | | 345/690 |
| 2016/0217731 A1 * | 7/2016 | Joo | G09G 3/3208 |
| 2017/0032730 A1 * | 2/2017 | Yeon | G09G 3/3607 |
| 2020/0013345 A1 | 1/2020 | Jeong | |
| 2020/0118478 A1 | 4/2020 | Pyo et al. | |
| 2020/0279518 A1 * | 9/2020 | Pyo | G09G 3/2074 |
| 2022/0319448 A1 * | 10/2022 | Li | G02F 1/133 |

FOREIGN PATENT DOCUMENTS

| | | |
|---|---|---|
| JP | 2007-199683 A | 8/2007 |
| KR | 10-2018-0060594 A | 6/2018 |
| KR | 10-2020-0004483 A | 1/2020 |

* cited by examiner

*Primary Examiner* — Nitin Patel
*Assistant Examiner* — Amen W Bogale
(74) *Attorney, Agent, or Firm* — Lewis Roca Rothgerber Christie LLP

(57) ABSTRACT

A display device includes: a pixel unit including a target pixel and peripheral pixels in a unit area set based on the target pixel; a converter configured to adjust a voltage level of a data voltage of the target pixel, based on light emission statuses of the peripheral pixels, and to determine a voltage level of a black voltage of at least one peripheral pixel which does not emit light among the peripheral pixels, based on the light emission statuses of the peripheral pixels; and a data driver configured to apply the data voltage to the target pixel, and to apply the black voltage to the at least one peripheral pixel which does not emit light.

24 Claims, 22 Drawing Sheets

FIG. 19

B_LUT1

| DBV | R_Black | G_Black | B_Black | Offset |
|---|---|---|---|---|
| 1200 | 6.10 | 6.10 | 6.10 | — |
| 1000 | 6.10 | 6.10 | 6.10 | 0.00 |
| 650 | 6.10 | 6.10 | 6.10 | 0.00 |
| 300 | 6.10 | 6.10 | 6.10 | 0.00 |
| 200 | 6.10 | 6.10 | 6.10 | 0.00 |
| 100 | 6.10 | 6.10 | 5.99 | −0.11 |
| 60 | 6.10 | 5.99 | 5.84 | −0.26 |
| 30 | 6.10 | 5.84 | 5.69 | −0.41 |
| 15 | 6.10 | 5.69 | 5.60 | −0.50 |
| 10 | 6.10 | 5.60 | 5.52 | −0.58 |
| 7 | 6.10 | 5.52 | 5.40 | −0.70 |
| 4 | 6.10 | 5.40 | | |

B_LUT2

| DBV | R_Black | G_Black | B_Black | Offset |
|---|---|---|---|---|
| 1200 | 6.10 | 6.10 | 6.10 | — |
| 1000 | 6.10 | 6.10 | 6.10 | 0.00 |
| 650 | 6.10 | 6.10 | 6.10 | 0.00 |
| 300 | 6.10 | 6.10 | 6.10 | 0.00 |
| 200 | 6.10 | 6.10 | 6.10 | 0.00 |
| 100 | 5.99 | 5.99 | 5.99 | −0.11 |
| 60 | 5.84 | 5.84 | 5.84 | −0.26 |
| 30 | 5.69 | 5.69 | 5.69 | −0.41 |
| 15 | 5.60 | 5.60 | 5.60 | −0.50 |
| 10 | 5.52 | 5.52 | 5.52 | −0.58 |
| 7 | 5.40 | 5.40 | 5.40 | −0.70 |
| 4 | | | | |

FIG. 20

B_LUT3

| Black Offset | Primary Colors | | | | | | Secondary Colors | | | Complex Colors |
|---|---|---|---|---|---|---|---|---|---|---|
| DBV | R | | G | | B | | C | M | Y | |
| | G_Black | B_Black | R_Black | B_Black | R_Black | G_Black | R_Black | G_Black | B_Black | |
| 1200 | 0.08 | 0.00 | 0.15 | 0.00 | 0.00 | 0.00 | 0.15 | 0.08 | 0.00 | |
| 1000 | 0.07 | 0.00 | 0.14 | 0.00 | 0.00 | 0.00 | 0.14 | 0.07 | 0.00 | |
| 650 | 0.07 | 0.00 | 0.13 | 0.00 | 0.00 | 0.00 | 0.13 | 0.07 | 0.00 | |
| 300 | 0.06 | 0.00 | 0.12 | 0.00 | 0.00 | 0.00 | 0.12 | 0.06 | 0.00 | |
| 200 | 0.06 | 0.00 | 0.11 | 0.00 | 0.00 | 0.00 | 0.11 | 0.06 | 0.00 | |
| 100 | 0.06 | 0.00 | 0.11 | 0.00 | 0.00 | 0.00 | 0.11 | 0.06 | 0.00 | |
| 60 | 0.06 | 0.00 | 0.11 | 0.00 | 0.00 | 0.00 | 0.11 | 0.06 | 0.00 | |
| 30 | 0.13 | 0.00 | 0.26 | 0.00 | 0.00 | 0.00 | 0.26 | 0.13 | 0.00 | |
| 15 | 0.21 | 0.00 | 0.41 | 0.00 | 0.00 | 0.00 | 0.41 | 0.21 | 0.00 | |
| 10 | 0.25 | 0.00 | 0.50 | 0.00 | 0.00 | 0.00 | 0.50 | 0.25 | 0.00 | |
| 7 | 0.29 | 0.00 | 0.58 | 0.00 | 0.00 | 0.00 | 0.58 | 0.29 | 0.00 | |
| 4 | 0.35 | 0.00 | 0.70 | 0.00 | 0.00 | 0.00 | 0.70 | 0.35 | 0.00 | |

FIG. 21

B_LUT4

| RV0_1 | VH |
|---|---|
| RV0_2 | VH − (VH − RV0) * 1 / 255 |
| RV0_3 | VH − (VH − RV0) * 2 / 255 |
| ⋮ | ⋮ |
| RV0_254 | VH − (VH − RV0) * 253 / 255 |
| RV0_255 | VH − (VH − RV0) * 254 / 255 |
| RV0_256 | RV0 |

FIG. 23

| B_LUT5 | Primary Colors | | | | | | | | | Secondary Colors | | | | | | General Blacks | | |
|---|---|---|---|---|---|---|---|---|---|---|---|---|---|---|---|---|---|---|
| Black | R | | | G | | | B | | | C | | M | | Y | | | | |
| DBV | G_Black | B_Black | R_Black | B_Black | R_Black | G_Black | R_Black | G_Black | B_Black | R_Black | B_Black | G_Black | B_Black | R_Black | G_Black | R_Black | G_Black | B_Black |
| 1200 | 6.18 | 6.10 | 6.25 | 6.10 | 6.10 | 6.10 | 6.10 | 6.10 | 6.10 | 6.25 | 6.10 | 6.18 | 6.10 | 6.10 | 6.10 | 6.10 | 6.10 | 6.10 |
| 1000 | 6.17 | 6.10 | 6.24 | 6.10 | 6.10 | 6.10 | 6.10 | 6.10 | 6.10 | 6.24 | 6.10 | 6.17 | 6.10 | 6.10 | 6.10 | 6.10 | 6.10 | 6.10 |
| 650 | 6.17 | 6.10 | 6.23 | 6.10 | 6.10 | 6.10 | 6.10 | 6.10 | 6.10 | 6.23 | 6.10 | 6.17 | 6.10 | 6.10 | 6.10 | 6.10 | 6.10 | 6.10 |
| 300 | 6.16 | 6.10 | 6.22 | 6.10 | 6.10 | 6.10 | 6.10 | 6.10 | 6.10 | 6.22 | 6.10 | 6.16 | 6.10 | 6.10 | 6.10 | 6.10 | 6.10 | 6.10 |
| 200 | 6.16 | 6.10 | 6.21 | 6.10 | 6.10 | 6.10 | 6.10 | 6.10 | 6.10 | 6.21 | 6.10 | 6.16 | 6.10 | 6.10 | 6.10 | 6.10 | 6.10 | 6.10 |
| 100 | 6.16 | 6.10 | 6.21 | 6.10 | 6.10 | 6.10 | 6.10 | 6.10 | 6.10 | 6.10 | 5.99 | 6.05 | 5.99 | 5.99 | 5.99 | 5.99 | 5.99 | 5.99 |
| 60 | 6.05 | 5.99 | 6.10 | 5.99 | 5.99 | 5.99 | 5.99 | 5.99 | 5.99 | 6.10 | 5.84 | 5.97 | 5.84 | 5.84 | 5.84 | 5.84 | 5.84 | 5.84 |
| 30 | 5.97 | 5.84 | 6.10 | 5.84 | 5.84 | 5.84 | 5.84 | 5.84 | 5.84 | 6.10 | 5.69 | 5.90 | 5.69 | 5.69 | 5.69 | 5.69 | 5.69 | 5.69 |
| 15 | 5.90 | 5.69 | 6.10 | 5.69 | 5.69 | 5.69 | 5.69 | 5.69 | 5.69 | 6.10 | 5.60 | 5.85 | 5.60 | 5.60 | 5.60 | 5.60 | 5.60 | 5.60 |
| 10 | 5.85 | 5.60 | 6.10 | 5.60 | 5.60 | 5.60 | 5.60 | 5.60 | 5.60 | 6.10 | 5.52 | 5.81 | 5.52 | 5.52 | 5.52 | 5.52 | 5.52 | 5.52 |
| 7 | 5.81 | 5.52 | 6.10 | 5.52 | 5.52 | 5.52 | 5.52 | 5.52 | 5.52 | 6.10 | 5.40 | 5.75 | 5.40 | 5.40 | 5.40 | 5.40 | 5.40 | 5.40 |
| 4 | 5.75 | 5.40 | 6.10 | 5.40 | 5.40 | 5.40 | 5.40 | 5.40 | 5.40 | 6.10 | 5.40 | 5.75 | 5.40 | 5.40 | 5.40 | 5.40 | 5.40 | 5.40 |

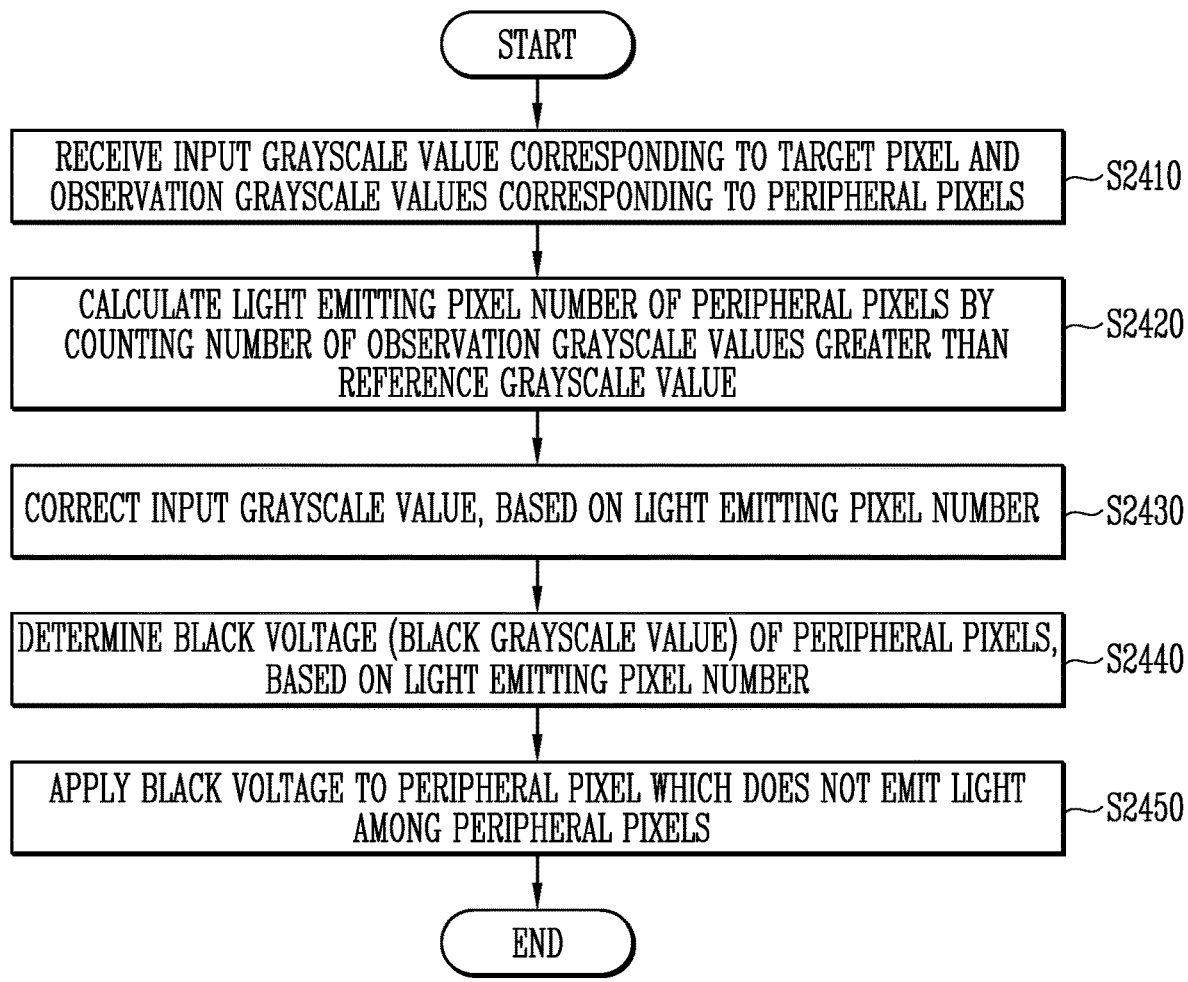

DISPLAY DEVICE AND METHOD OF DRIVING THE SAME

CROSS-REFERENCE TO RELATED APPLICATION

The present application claims priority to and the benefit of Korean patent application 10-2020-0052779 filed on Apr. 29, 2020, in the Korean Intellectual Property Office, the entire disclosure of which is incorporated herein by reference.

BACKGROUND

1. Field

Aspects of some example embodiments of the present disclosure relate to a display device and a method of driving the same.

2. Related Art

An organic light emitting display device may include a plurality of pixels, and allow organic light emitting diodes of the plurality of pixels to respectively emit lights, based on grayscale voltages corresponding to grayscale values in image data, thereby displaying an image frame (or image).

In general, when pixels of different colors emit light in response to the same grayscale, a white color light is emitted from the organic light emitting display device, and grayscale values of the pixels are set to have a luminance according to a gamma curve preferred by the white color light.

When an organic light emitting display device emits single color light or mixed color light instead of the white color light by using the grayscale voltages, the luminance of the mixed color light or the single color light does not accurately correspond to the gamma curve. Also, when the organic light emitting display device emits a single color of light, lateral leakage in which holes of driving current flowing through a corresponding pixel are leaked to adjacent pixels having low resistance through a P-doped Hole Injection Layer (PHIL) as a layer shared by the organic light emitting diodes may occur, and therefore, the organic light emitting display device may not emit light with a desired luminance.

The above information disclosed in this Background section is only for enhancement of understanding of the background and therefore the information discussed in this Background section does not necessarily constitute prior art.

SUMMARY

Aspects of some example embodiments include a display device capable of exhibiting a desired luminance even when single color light and mixed color lights are emitted in addition to when white color light is emitted, and a method of driving the display device.

According to some example embodiments of the present disclosure, a display device includes: a pixel unit including a target pixel and peripheral pixels located in a unit area set based on the target pixel; a converter configured to adjust a voltage level of a data voltage of the target pixel, based on light emission statuses of the peripheral pixels, and determine a voltage level of a black voltage of at least one peripheral pixel which does not emit light among the peripheral pixels, based on the light emission statuses of the peripheral pixels; and a data driver configured to apply the data voltage to the target pixel, and apply the black voltage to the at least one peripheral pixel which does not emit light.

According to some example embodiments, the target pixel may be a first color pixel emitting light of a first color. The peripheral pixels may include second color pixels emitting light of a second color and third color pixels emitting light of a third color.

According to some example embodiments, the first color may be one of red and green colors, the second color may be another of the red and green colors, and the third color may be a blue color. Under a condition in which a luminance of the unit area is constant, the converter may vary a voltage level of a black voltage of the second color pixels, based on the light emission statuses, and maintain a voltage level of a black voltage of the third color pixels constant.

According to some example embodiments, the unit area may be an area within a first radius with respect to the target pixel. The first radius may correspond to a distance between the target pixel and a first color pixel most adjacent to the target pixel.

According to some example embodiments, the converter may set the black voltage of the second color pixels to have a first voltage level, when it is determined that at least one of the second color pixels emits light, and set the black voltage to have a second voltage level, when it is determined that all the second color pixels do not emit light.

According to some example embodiments, each of the target pixel and the peripheral pixels may include a light emitting element and a driving transistor which controls an amount of driving current flowing through the light emitting element in response to the data voltage. The driving transistor may be implemented with a P-type transistor. The second voltage level may be higher than the first voltage level.

According to some example embodiments, the converter may include: a grayscale converter configured to determine the light emission statuses of the peripheral pixels, based on adjacent grayscale values of the peripheral pixels, and generate a corrected grayscale value by correcting an input grayscale value of the target pixel, based on the light emission statuses of the peripheral pixels; and a black voltage converter configured to set a black grayscale value representing the voltage level of the black voltage, based on the light emission statuses of the peripheral pixels.

According to some example embodiments, the display device may further include a voltage generator configured to generate reference gamma voltages and reference black voltages. The data driver may select one of the reference gamma voltages, based on the corrected grayscale value, and output, as the data voltage, the one selected among the reference gamma voltages. The data driver may select one of the reference black voltages, based on the black grayscale value, and output, as the black voltage, the one selected among the reference black voltages.

According to some example embodiments, the grayscale converter may determine a color displayed in the unit area, based on the light emission statuses of the peripheral pixels, as one of a single color, a double mixed color, and a triple mixed color. When the color in the unit area is a single color or a double mixed color, the black voltage converter may determine a black offset value of the at least one peripheral pixel and calculate the black grayscale value, based on the black offset value.

According to some example embodiments, the black voltage converter may include: a black voltage offset setting unit configured to determine the black offset value corresponding to the light emission statuses by using a first lookup table; a black voltage leveling unit configured to generate black grayscale values respectively corresponding to the reference black voltages; and a black voltage matching unit configured to select the black grayscale value corresponding to the black offset value among the black grayscale values.

According to some example embodiments, the black voltage converter may vary the black offset value depending on a luminance of the unit area.

According to some example embodiments, the target pixel may emit light of the red color. The peripheral pixels may include green color pixels emitting light of the green color and blue color pixels emitting light of the blue color. When the green color pixels do not emit light, the black voltage offset setting unit may set a black offset value of the green color pixels to be greater than 0.

According to some example embodiments, the black voltage offset setting unit may set a black offset value of the blue color pixels to be 0.

According to some example embodiments, the target pixel may emit light of the blue color. The peripheral pixels may include red color pixels emitting light of the red color and blue color pixels emitting light of the blue color. When the red pixels do not emit light, the black voltage offset setting unit may set a black offset value of the red color pixels to be greater than 0.

According to some example embodiments, the pixel unit may include a first unit area and a second unit area. The at least one peripheral pixel may be located in each of the first unit area and the second unit area. The black voltage converter may further include a redundancy processor configured to select one of a first black voltage set with respect to the at least one peripheral pixel in the first unit area and a second black voltage set with respect to the at least one peripheral pixel in the second unit area or average the first black voltage and the second black voltage, when the first black voltage and the second black voltage are different from each other.

According to some example embodiments, the grayscale converter may calculate a pixel number of peripheral pixels emitting light among the peripheral pixels, determine an offset value, based on the color and the pixel number, and calculate the corrected grayscale value by adding the offset value to the input grayscale value.

According to some example embodiments of the present disclosure, a display device includes: a pixel unit including a first color pixel emitting light of a first color and second color pixels which are located in a unit area set based on the first color pixel and emit light of a second color; a converter configured to adjust a voltage level of a data voltage of the first color pixel, based on light emission statuses of the second color pixels, set a black voltage of the second color pixels to have a first voltage level when at least one of the second color pixels emits light, and set the black voltage to have a second voltage level when the second color pixels do not emit light; and a data driver configured to apply the black voltage to the second color pixels.

According to some example embodiments, the first color may be one of red and green colors, and the second color may be another of the red and green colors.

According to some example embodiments, each of the first color pixel and the second color pixels may include a light emitting element and a driving transistor which controls an amount of driving current flowing through the light emitting element in response to the data voltage. The driving transistor may be implemented with a P-type transistor. The second voltage level may be higher than the first voltage level.

According to some example embodiments of the present disclosure, in a method of driving a display device including a target pixel and peripheral pixels located in a unit area set based on the target pixel, the method includes: receiving an input grayscale value corresponding to the target pixel and observation grayscale values corresponding to the peripheral pixels; calculating a light emitting pixel number of the peripheral pixels by counting a number of observation grayscale values, which exceeds a reference grayscale value; determining a black voltage of the peripheral pixels, based on the light emitting pixel number; and applying the black voltage to a peripheral pixel which does not emit light among the peripheral pixels, wherein an observation grayscale value of the peripheral pixel which does not emit light corresponds to a minimum grayscale within a grayscale range of the input grayscale value.

According to some example embodiments, the target pixel may be a first color pixel emitting light of a first color. The peripheral pixels may include second color pixels emitting light of a second color and third color pixels emitting light of a third color. The calculating the light emitting pixel number may include: calculating a first light emitting pixel number of the second color pixels; and calculating a second light emitting pixel number of the third color pixels.

According to some example embodiments, the first color may be one of red and green colors, the second color may be another of the red and green colors, and the third color may be a blue color. The determining of the black voltage may include variably setting a voltage level of a black voltage of the second color pixels, based on the first light emitting pixel number, under a condition in which a luminance of the unit area is constant.

According to some example embodiments, the determining of the black voltage may include setting a black grayscale value of the peripheral pixels, based on the light emitting pixel number. The applying of the black voltage may include selecting one of set or predetermined black voltages, based on the black grayscale value, and applying the selected black voltage to the peripheral pixel which does not emit light.

According to some example embodiments, the display device may include a first unit area and a second unit area. The peripheral pixel which does not emit light may be located in each of the first unit area and the second unit area. The determining of the black voltage may include: setting a first black voltage of the peripheral pixel which does not emit light with respect to the first unit area; setting a second black voltage of the peripheral pixel which does not emit light with respect to the second unit area; and selecting one of the first black voltage and the second black voltage or averaging the first black voltage and the second black voltage, when the first black voltage and the second black voltage are different from each other.

BRIEF DESCRIPTION OF THE DRAWINGS

Aspects of some example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 19 illustrates lookup tables representing normal black voltages according to luminances of the pixels included in the display device shown in FIG. 1.

FIG. 20 illustrates a lookup table representing black offsets of pixels according to a display color in a unit area included in the display device shown in FIG. 1.

FIG. 21 is a diagram illustrating an example of a lookup table generated in a black voltage leveling unit included in the converter shown in FIG. 12.

FIG. 23 illustrates a lookup table representing black voltages finally set by the converter shown in FIG. 12.

FIG. 24 is a flowchart illustrating a method of driving a display device according to some example embodiments of the present disclosure.

DETAILED DESCRIPTION

Figure 1:
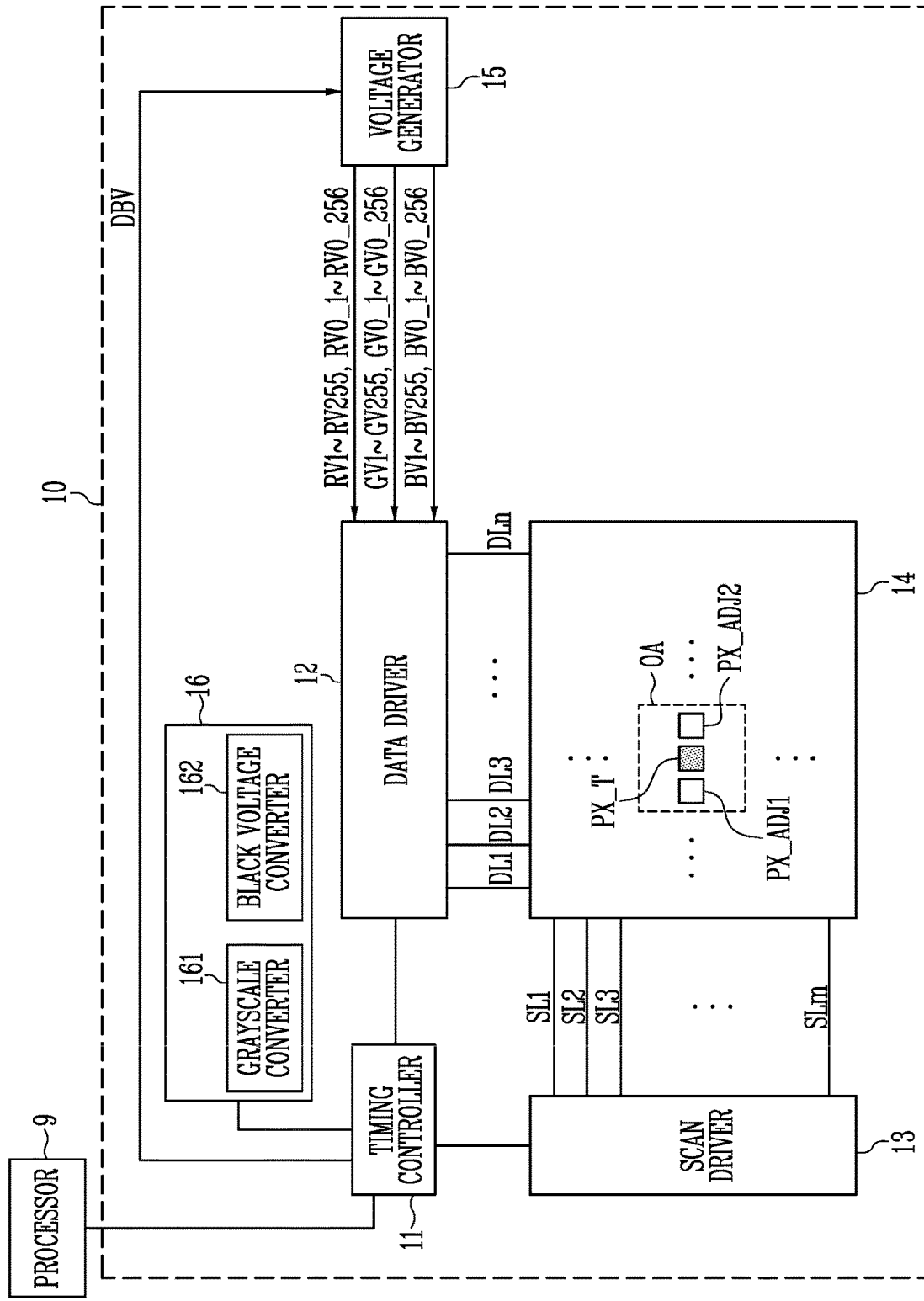
FIG. 1 is a block diagram illustrating a display device according to some example embodiments of the present disclosure.

Hereinafter, aspects of some example embodiments are described in more detail with reference to the accompanying drawings so that those skilled in the art may easily practice embodiments according to the present disclosure. Embodiments according to the present disclosure may be implemented in various different forms and are not limited to the example embodiments described in the present specification.

Certain components or elements that are not necessary to convey the scope of embodiments may be omitted to more clearly describe embodiments according to the present disclosure, and the same or similar constituent elements will be designated by the same reference numerals throughout the specification. Therefore, the same reference numerals may be used in different drawings to identify the same or similar elements.

In addition, the size and thickness of each component illustrated in the drawings are arbitrarily shown for better understanding and ease of description, but embodiments according to the present disclosure are not limited thereto. Thicknesses of several portions and regions are exaggerated for clear expressions.

FIG. 1 is a block diagram illustrating a display device in according to some example embodiments of the present disclosure.

Referring to FIG. 1, the display device 10 may be connected to a processor 9, and include a timing controller 11, a data driver 12 (or source driver), a scan driver 13 (or gate driver), a pixel unit 14 (or display panel), a voltage generator 15, and a converter 16 (or corrector).

The processor 9 may provide input image data about an image frame and control signals. The input image data may include grayscale values, and the control signals may include a vertical synchronization signal, a horizontal synchronization signal, and a clock signal. The processor 9 may include an application processor, a central processing unit (CPU), a graphics processing unit (GPU), and the like. The processor 9 may provide the display device 10 with grayscale values matched to a structure (e.g., a pentile structure or an RGB stripe structure, as an arrangement of pixels PX_T, PX_ADJ1, and PX_ADJ2) of the pixel unit 14. For example, the processor 9 may provide the display device 10 with grayscales to correspond one-to-one to the pixels PX_T, PX_ADJ1, and PX_ADJ2 included in the pixel unit 14. Alternatively, the processor 9 may provide grayscales of the pixel unit 14 to the display device 10 regardless of the structure of the pixel unit 14. For example, the processor 9 may provide a red grayscale value, a green grayscale value, and a blue grayscale value with respect to one dot as a basic unit for displaying full colors. A number of the grayscale values provided from the processor 9 may be different from that of the pixels PX_T, PX_ADJ1, and PX_ADJ2 included in the pixel unit 14.

The timing controller 11 may receive input image data and control signals from the processor 9. When the input image data includes grayscale values matched to the structure of the pixel unit 14, the timing controller 11 may transfer the grayscale values to the converter 16. When the input image data includes grayscale values unrelated to the structure of the pixel unit 14, the timing controller 11 may generate rendered grayscale values corresponding one-to-one to the pixels included in the pixel unit 14 by rendering the grayscale values, and provide the rendered grayscale values to the converter 16.

The converter 16 may generate converted grayscale values by correcting grayscale values. The converter 16 will be described in more detail after description of the pixel unit 14.

The timing controller 11 may provide the data driver 12 with converted grayscale values and a data control signal (e.g., a data enable signal corresponding to a vertical start signal). Also, the timing controller 11 may provide the scan driver 13 with a scan control signal (e.g., a clock signal and a scan start signal corresponding to the vertical start signal).

The data driver 12 may generate data voltages, based on the converted grayscale values and the data control signal, and provide the data voltages to data lines DL1, DL2, DL3, . . . , and DLn (n is a positive integer). For example, the data driver 12 may sample the converted grayscale values by using a clock signal, and provide the data lines DL1, DL2, DL3, . . . , and DLn with data voltages corresponding to the converted grayscale values in a unit of a pixel row. For example, the data driver 12 may select one of reference voltages RV1 to RV255, RV0_1 to RV0_256, GV1 to GV255, GV0_1 to GV0_256, BV1 to BV255, and BV0_1 to BV0_256 provided from the voltage generator 15, based on one of the converted grayscale values, and output, as a data voltage, the selected reference voltage among the voltages RV1 to RV255, RV0_1 to RV0_256, GV1 to GV255, GV0_1 to GV0_256, BV1 to BV255, and BV0_1 to BV0_256.

The scan driver 13 may generate scan signals, based on the scan control signal, and provide the scan signals to scan lines SL1, SL2, SL3, . . . , and SLm (m is a positive integer). For example, the scan driver 13 may sequentially provide scan signals having a pulse of a turn-on level to the scan lines SL1, SL2, SL3, . . . , and SLm. The turn-on level may be a voltage level at which a transistor is turned on. For example, the scan driver 13 may be configured in the form of a shift register including a plurality of stage circuits, and generate scan signals in a manner that sequentially transfers the scan start signal having a pulse of a turn-on level to a next scan stage circuit in response to the clock signal.

The pixel unit 14 may include pixels PX_T, PX_ADJ1, and PX_ADJ2. Each of the pixels PX_T, PX_ADJ1, and PX_ADJ2 may be connected to a corresponding data line and a corresponding scan line.

The pixel unit 14 may include first color pixels emitting light of a first color, second color pixels emitting light of a second color, and third color pixels emitting light of a third color. The first color, the second color, and the third color may be colors that are different from one another. For example, the first color may be one color among red, green, and blue colors, the second color may be another color among the red, green, and blue colors, and the third color may be the other color among the red, green, and blue colors. In addition, magenta, cyan, and yellow colors may be used as the first to third colors, instead of the red, green, and blue colors. However, for convenience of description, it is described that the red, green, and blue colors are used as the first to third colors, the magenta is expressed as a combination of the red and blue colors, the cyan is expressed as a combination of the green and blue colors, and the yellow color is expressed as a combination of the red and green colors.

According to some example embodiments, the pixel unit 14 may include a target pixel PX_T and peripheral pixels PX_ADJ1 and PX_ADJ2. The target pixel PX_T may be a pixel which becomes a reference when a converted grayscale value is generated in the converter 16, and the peripheral pixels PX_ADJ1 and PX_ADJ2 may be pixels located in a unit area OA set by using the target pixel PX_T as the reference. The peripheral pixels PX_ADJ1 and PX_ADJ2 may be adjacent to the target pixel PX_T. Any other pixel is not disposed between the target pixel PX_T and the peripheral pixels PX_ADJ1 and PX_ADJ2, and the target pixel PX_T and the peripheral pixels PX_ADJ1 and PX_ADJ2 may be influenced by mutual side leakage. For example, a driving current may be leaked to the peripheral pixels PX_ADJ1 and PX_ADJ2 or be introduced from the peripheral pixels PX_ADJ1 and PX_ADJ2 through a light emitting diode of the target pixel PX_T.

Hereinafter, the position of each of the pixels PX_T, PX_ADJ1, and PX_ADJ2 is described with respect to the position of a light emitting diode (particularly, a light emitting layer). The position of a pixel circuit connected to each light emitting diode may not correspond to that of the light emitting diode, and the pixel circuit and the light emitting diode may be appropriately disposed so as to achieve space efficiency.

The unit area OA, the target pixel PX_T, and the peripheral pixels PX_ADJ1 and PX_ADJ2 will be described later with reference to FIG. 2.

The voltage generator 15 may receive an input maximum luminance value DBV, and provide first reference voltage RV1 to RV255 and RV0_1 to RV0_256, (first grayscale voltages, or first gamma voltages) for pixels of the first color, second reference voltages GV1 to GV255 and GV0_1 to GV0_256 for pixels of the second color, and third reference voltages BV1 to BV255 and BV0_1 to BV0_256 for pixels of the third color, which correspond to the input maximum luminance value DBV. The first reference voltage RV1 to RV255 and RV0_1 to RV0_256 may include first reference gamma voltages RV1 to RV255 and first reference black voltages RV0_1 to RV0_256. The first reference gamma voltages RV1 to RV255 may correspond to grayscales in a range of 1 to 255 among grayscales in a range of 0 to 255, and one selected from the first reference black voltages RV0_1 to RV0_256 may correspond to a grayscale of 0. Similarly, the second reference voltage GV1 to GV255 and GV0_1 to GV0_256 may include second reference gamma voltages GV1 to GV255 and second reference black voltages GV0_1 to GV0_256, and the third reference voltage BV1 to BV255 and BV0_1 to BV0_256 may include third reference gamma voltages BV1 to BV255 and third reference black voltages BV0_1 to BV0_256.

Although a case where grayscale values include a total of 256 grayscales from a grayscale (e.g., a minimum grayscale) of 0 to a grayscale (e.g., a maximum grayscale) of 255 is described for convenience of description, embodiments according to the present disclosure are not limited thereto. For example, when each of the grayscale values is expressed with eight bits or more, a larger number of grayscales may exist. The minimum grayscale may be the darkest grayscale, and the maximum grayscale may be the brightest grayscale.

A maximum luminance value may be a luminance value of light emitted from the pixel unit 14 (the unit area OA, or the pixels PX_T, PX_ADJ1, and PXADJ2 corresponding to the maximum grayscale. For example, when a pixel of the first color emits light corresponding to the grayscale of 255, a pixel of the second color emits light corresponding to the grayscale of 255, and a pixel of the third color emits light corresponding to the grayscale of 255, wherein the pixel of the first color, the pixel of the second color, and the pixel of the third color constitute one dot, a luminance value of light, e.g., white color light generated by a combination of the first to third colors may be the maximum luminance value. A unit of the luminance value may be nit.

Therefore, the pixel unit 14 may display a partially (or spatially) dark or bright image frame, but a maximum brightness of the image frame is limited to the maximum luminance value. The maximum luminance value may be manually set by manipulation of a user with respect to the display device 10, or be automatically set by an algorithm associated with an illumination sensor, etc. The maximum luminance value set in this manner is expressed as an input maximum luminance value.

For example, luminance may have a maximum value of 1200 nits and have a minimum value of 4 nits. When the input maximum luminance value DBV is changed even though the same grayscale value is provided, the reference voltages RV1 to RV255, RV0_1 to RV0_256, GV1 to GV255, GV0_1 to GV0_256, BV1 to BV255, and BV0_1 to BV0_256 are changed, and accordingly, the luminance of the pixel unit 14 (or the pixels PX_T, PX_ADJ1, and PX_ADJ2) is also changed.

The converter 16 may determine light emission statuses of the peripheral pixels PX_ADJ1 and PX_ADJ2 in the unit area OA, based on grayscale values of the peripheral pixels PX_ADJ1 and PX_ADJ2, and generate a corrected grayscale value by correcting a grayscale value of the target pixel PX_T, based on the light emission status. Hereinafter, for convenience of description, the grayscale value of the target pixel PX_T will be designated as an input grayscale value, and the grayscale values of the peripheral pixels PX_ADJ1 and PX_ADJ2 will be designated as observation grayscale values.

Also, the converter 16 may determine a black grayscale value (or black voltage) of at least one peripheral pixel which does not emit light among the peripheral pixels PX_ADJ1 and PX_ADJ2, based on light emission statuses of the peripheral pixels PX_ADJ1 and PX_ADJ2. The black grayscale value is a grayscale value representing a voltage level of a data voltage (e.g., a data voltage corresponding to the minimum grayscale) provided to the peripheral pixels PX_ADJ1 and PX_ADJ2 which do not emit light, when the peripheral pixels PX_ADJ1 and PX_ADJ2 do not emit light. One black voltage among the black voltages RV0_1 to RV0_256, GV0_1 to GV0_256, and BV0_1 to BV0_256 generated in the voltage generator 15 may be selected based on the black grayscale value, and the selected one black voltage may be provided as a data voltage to a corresponding pixel. The corrected grayscale value and the black grayscale value may be included in a converted grayscale value. For example, a corrected grayscale value of 8 bits and a black grayscale value of 8 bits may be expressed as a converted grayscale value of 9 bits.

According to some example embodiments, the converter 16 may include a grayscale converter 161 (or grayscale corrector) and a black voltage converter 162 (or black voltage corrector).

The grayscale converter 161 may determine each of light emission statuses of the peripheral pixels PX_ADJ1 and PX_ADJ2 (or a number of light emitting pixels for each color) in the unit area OA, and correct an input grayscale value of the target pixel PX_T, based on the light emission statuses. The light emission statuses respectively represent whether the peripheral pixel PX_ADJ1 emits or does not emit light and whether the peripheral pixel PX_ADJ2 emits or does not emit light, and it may be determined whether the unit area OA emits single color light, double mixed color light, triple mixed color light, or white color light, based on the light emission statuses.

The black voltage converter 162 may set a black grayscale value (or a voltage level of a black voltage) of the peripheral pixels PX_ADJ1 and PX_ADJ2, based on the light emission statuses of the peripheral pixels PX_ADJ1 and PX_ADJ2 in the unit area OA.

For example, when the unit area OA includes first color pixels (e.g., red pixels) and second color pixels (e.g., green pixels), at least one of the first color pixels emits light, and all the second color pixels emit light, the black voltage converter 162 may set a black grayscale value such that a black voltage of the second color pixels becomes relatively high (e.g., such that the black voltage becomes higher than that when at least one of the second color pixels emits light). According to some example embodiments, when at least one of the second color pixels emits light in the unit area OA, and all the first color pixels in the unit area OA do not emit light, the black voltage converter 162 may set a black grayscale value such that a black voltage of the first color pixels becomes relatively high (e.g., such that the black voltage becomes higher than that when at least one of the first color pixels emits light).

Meanwhile, when the unit area OA includes third color pixels (e.g., blue pixels), the black voltage converter 162 may set a black grayscale value such that a black voltage of the third color pixels is maintained constant under the same luminance condition, regardless of emission statuses of the first color pixels and the second color pixels.

A more detailed configuration and operation of the converter 16 will be described later with reference to FIG. 12.

Meanwhile, a case where the converter 16 is a component separate from the timing controller 11 has been illustrated in FIG. 1. However, according to some example embodiments, at least a portion of the converter 16 may be integrally configured with the timing controller 11. For example, at least a portion of the converter 16 along with the timing controller 11 may be configured in the form of an integrated circuit. According to some example embodiments, at least a portion of the converter 16 may be implemented in a software manner in the timing controller 11.

According to some example embodiments, at least a portion of the converter 16 along with the data driver 12 may be configured in the form of an integrated circuit. According to some example embodiments, at least a portion of the converter 16 may be implemented in a software manner in the data driver 12.

According to some example embodiments, at least a portion of the converter 16 along with the processor 9 may be configured in the form of an integrated circuit.

As described with reference to FIG. 1, the display device 10 corrects an input grayscale value of the target pixel PX_T, based on light emission statuses of the peripheral pixels PX_ADJ1 and PX_ADJ2 in the unit area OA, which is set with respect to the target pixel PX_T, and varies a black voltage of the peripheral pixels PX_ADJ1 and PX_ADJ2. Thus, side leakage can be prevented or reduced, and a desired luminance can be exhibited even when the pixel unit 14 displays an image of single color light and mixed color light.

Figure 2:
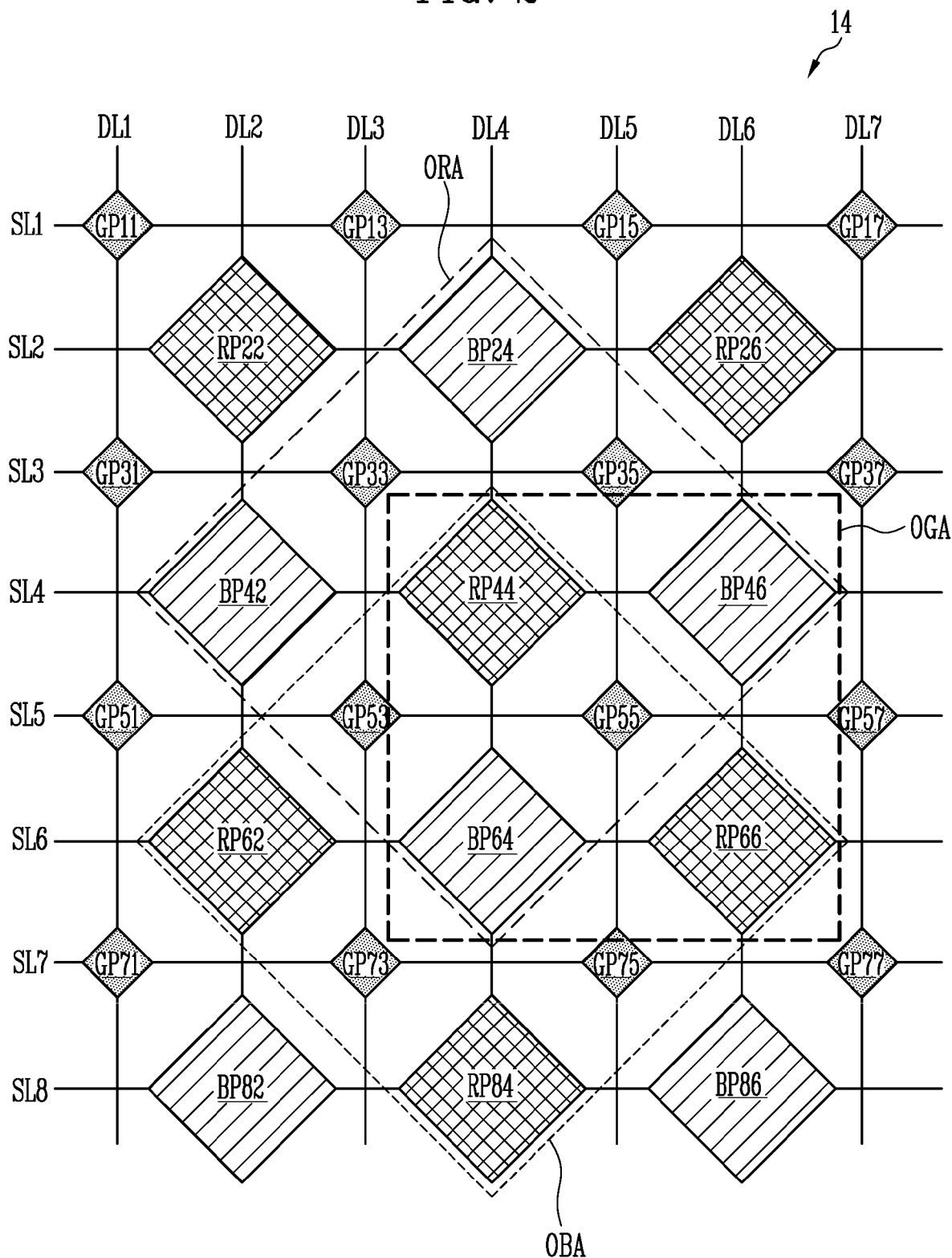
FIG. 2 is a plan view illustrating an example of a pixel unit included in the display device shown in FIG. 1.

FIG. 2 is a plan view illustrating an example of the pixel unit included in the display device shown in FIG. 1. A portion of the pixel unit 14 is illustrated as an example in FIG. 2.

Referring to FIG. 2, pixels RP22, RP26, RP44, RP62, RP66, RP84, GP11, GP13, GP15, GP17, GP31, GP33, GP35, GP37, GP51, GP53, GP55, GP57, GP71, GP73, GP75, GP77, BP24, BP42, BP46, BP64, BP82, and BP86 are illustrated with respect to positions of light emitting diodes thereof, and scan lines SL1 to SL8 and data lines DL1 to DL7 are briefly illustrated to describe an electrical connection relationship of the pixel unit 14.

The pixels RP22, RP26, RP44, RP62, RP66, RP84, GP11, GP13, GP15, GP17, GP31, GP33, GP35, GP37, GP51, GP53, GP55, GP57, GP71, GP73, GP75, GP77, BP24, BP42, BP46, BP64, BP82, and BP86 may include first color pixels RP22, RP26, RP44, RP62, RP66, and RP84, second color pixels GP11, GP13, GP15, GP17, GP31, GP33, GP35, GP37, GP51, GP53, GP55, GP57, GP71, GP73, GP75, and GP77, and third color pixels BP24, BP42, BP46, BP64, BP82, and BP86.

The first color pixels RP22, RP26, RP44, RP62, RP66, and RP84 may emit light of a first color, and the first color may be, for example, red. The second color pixels GP11, GP13, GP15, GP17, GP31, GP33, GP35, GP37, GP51, GP53, GP55, GP57, GP71, GP73, GP75, and GP77 may emit light of a second color, and the second color may be, for example, green. The third color pixels BP24, BP42, BP46, BP64, BP82, and BP86 may emit light of a third color, and the third color may be, for example, blue.

According to some example embodiments, the first color pixels RP22, RP26, RP44, RP62, RP66, and RP84, the second color pixels GP11, GP13, GP15, GP17, GP31, GP33, GP35, GP37, GP51, GP53, GP55, GP57, GP71, GP73, GP75, and GP77, and the third color pixels BP24, BP42, BP46, BP64, BP82, and BP86 may be arranged in an RGBG diamond pentile structure.

Each of the first color pixels RP22, RP26, RP44, RP62, RP66, and RP84, the second color pixels GP11, GP13, GP15, GP17, GP31, GP33, GP35, GP37, GP51, GP53, GP55, GP57, GP71, GP73, GP75, and GP77, and the third color pixels BP24, BP42, BP46, BP64, BP82, and BP86 may be connected to a corresponding scan line among the scan lines SL1 to SL8 and a corresponding data line among the data lines DL1 to DL7.

Meanwhile, although a case where odd-numbered scan lines SL1, SL3, SL5, and SL7 are connected to the second color pixels GP11, GP13, GP15, GP17, GP31, GP33, GP35, GP37, GP51, GP53, GP55, GP57, GP71, GP73, GP75, and GP77, and even-numbered scan lines SL2, SL4, SL6, and SL8 are connected to the first color pixels RP22, RP26, RP44, RP62, RP66, and RP84 and the third color pixels BP24, BP42, BP46, BP64, BP82, and BP86 is illustrated in FIG. 2, embodiments according to the present disclosure are not limited thereto. For example, a second scan line SL2 may be connected to a first scan line SL1, or the first scan line SL1 and the second scan line SL2 may be configured as one scan line. The same scan signal may be provided to the first scan line SL1 and the second scan line SL2.

When a forty-fourth pixel RP44 (e.g., a first color pixel disposed in a fourth row and a fourth column) is the target pixel PX_T described with reference to FIG. 1, a first unit area ORA may be set as an area within a first radius with respect to the forty-fourth pixel RP44, and peripheral pixels of the forty-fourth pixel RP44 may include a twenty-fourth pixel BP24, a thirty-third pixel GP33, a thirty-fifth pixel GP35, a forty-second pixel BP42, a forty-sixth pixel BP46, a fifty-third pixel GP53, a fifty-fifth pixel GP55, and a sixty-fourth pixel BP64 in the first unit area ORA. For example, the first radius may correspond to a distance (e.g., a distance between pixel centers) from the forty-fourth pixel RP44 to a twenty-second pixel R22, (a twenty-sixth pixel RP26, a sixty-second pixel PR62, or a sixty-sixth pixel RPG66) which emits light of the same color as the forty-fourth pixel RP44 and is adjacent to the forty-fourth pixel RP44.

When the fifty-fifth pixel GP55 (e.g., a second color pixel disposed in a fifth row and a fifth column) is the target pixel PX_T, a second unit area OGA may be set as an area within a second radius with respect to the fifty-fifth pixel GP55. For example, the second radius may correspond to a distance from the fifty-fifth pixel GP55 to the thirty-fifth pixel GP35, (the fifty-third pixel GP53, a fifty-seventh pixel GP57, or a seventy-fifth pixel GP75) which emits light of the same color as the fifty-fifth pixel GP55 and is adjacent to the fifty-fifth pixel GP55. Peripheral pixels of the fifty-fifth pixel GP55 may include the forty-fourth pixel RP44, the forty-sixth pixel BP46, the sixty-fourth pixel BP64, and the sixty-sixth pixel RP66 in the second unit area OGA.

Similarly, when the sixty-fourth pixel BP64 (e.g., a third color pixel disposed in a sixth row and the fourth column) is the target pixel PX_T, a third unit area OBA may be set as an area within a third radius with respect to the sixty-fourth pixel BP64. For example, the third radius may correspond to a distance from the sixty-fourth pixel BP64 to the forty-second pixel BP42. Peripheral pixels of the sixty-fourth pixel BP64 may include the forty-fourth pixel RP44, the fifty-third pixel GP53, the fifty-fifth pixel GP55, the sixty-second pixel RP62, the sixty-sixth pixel RP66, a seventy-third pixel GP73, the seventy-fifth pixel GP75, and an eighty-fourth pixel RP84 in the third unit area OBA.

Meanwhile, although a case where the first color pixels RP22, RP26, RP44, RP62, RP66, and RP84, the second color pixels GP11, GP13, GP15, GP17, GP31, GP33, GP35, GP37, GP51, GP53, GP55, GP57, GP71, GP73, GP75, and GP77, and the third color pixels BP24, BP42, BP46, BP64, BP82, and BP86 are arranged in a diamond pentile structure has been illustrated in FIG. 2, embodiments according to the present disclosure are not limited thereto. For example, the pixels may be arranged in another structure, e.g., in the form of an RGB-stripe, an S-stripe, a real RGB, a normal pentile, or the like. Each of the unit areas ORA, OGA, and OBA is disposed adjacent to the target pixel PX_T, and may be appropriately set to include peripheral pixels emitting light of a color different from that of the target pixel PX_T.

Figure 3:
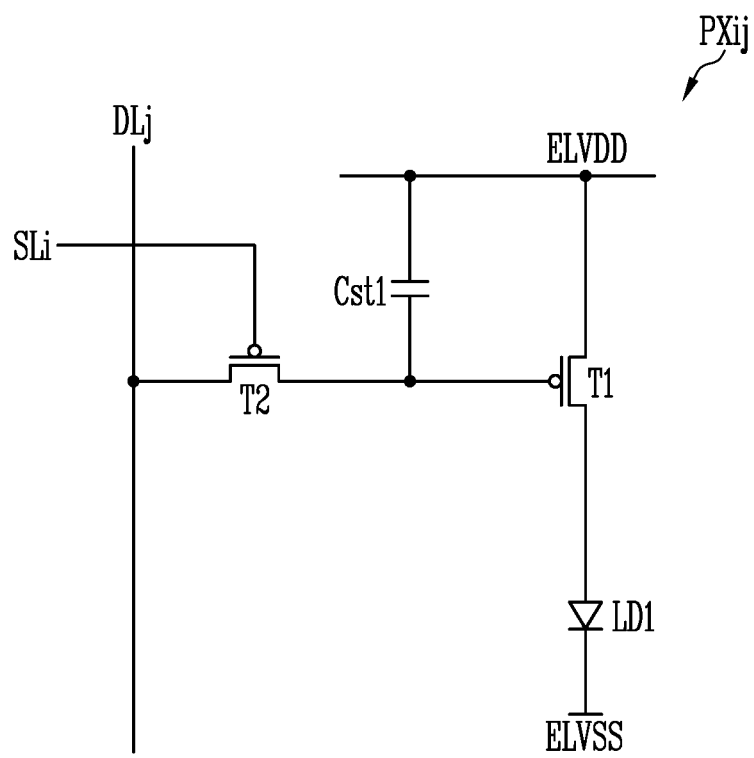
FIG. 3 is a circuit diagram illustrating an example of a pixel included in the display device shown in FIG. 1.
Figure 4:
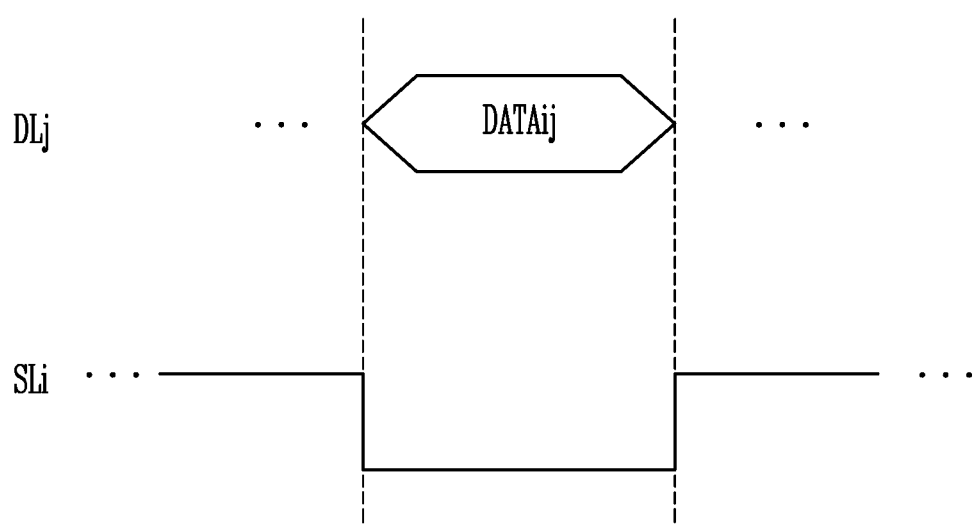
FIG. 4 is a waveform diagram illustrating an operation of the pixel shown in FIG. 3.

FIG. 3 is a circuit diagram illustrating an example of the pixel included in the display device shown in FIG. 1. FIG. 4 is a waveform diagram illustrating an operation of the pixel shown in FIG. 3. The pixels PX_T, PX_ADJ1, and PX_ADJ2 shown in FIG. 1 are substantially identical or similar to one another, and therefore, a pixel PXij located in an ith pixel row and a jth pixel column will be described, including the pixels PX_T, PX_ADJ1, and PX_ADJ2.

Referring to FIGS. 3 and 4, the pixel PXij may include a first transistor T1, a second transistor T2, a storage capacitor Cst1, and a light emitting diode LD1.

The transistors may be implemented with a P-type transistor, e.g., a PMOS transistor, but embodiments according to the present disclosure are not limited thereto. For example, at least one of the transistors may be implemented with an N-type transistor (e.g., an NMOS transistor).

A first electrode of the first transistor T1 may be connected to a first power line ELVDD, a second electrode of the first transistor T1 may be connected to an anode electrode of the light emitting diode LD1 (or light emitting element), and a gate electrode of the first transistor T1 may be connected to a second electrode of the second transistor T2. The first transistor T1 may be referred to as a driving transistor.

A first electrode of the second transistor T2 may be connected to a data line DLj, the second electrode of the second transistor T2 may be connected to the gate electrode of the first transistor T1, and a gate electrode of the second transistor T2 may be connected to a scan line SLi. The second transistor T2 may be referred to as a scan transistor, a switching transistor, etc.

The storage capacitor Cst1 may be connected or formed between the first electrode (or the first power line ELVDD) and the gate electrode of the first transistor T1.

The anode electrode of the light emitting diode LD1 may be connected to the second electrode of the first transistor T1, and a cathode electrode of the light emitting diode LD1 may be connected to a second power line ELVSS. The light emitting diode LD1 may be configured as an organic light emitting diode or an inorganic light emitting diode such as a micro light emitting diode (LED) or a quantum dot light emitting diode. Also, the light emitting diode LD1 may be a light emitting element made of a combination of an organic material and an inorganic material. In FIG. 3, a case where the pixel PXij includes a single light emitting diode LD1 is illustrated. However, according to some example embodiments, the pixel PXij may include a plurality of light emitting diodes. The plurality of light emitting diodes may be connected in parallel to each other or be connected in series to each other.

When a scan signal having a turn-on level (e.g., a low level) is supplied to the gate electrode of the second transistor T2 through the scan line SLi, the second transistor T2 may connect the data line DLj to one electrode of the storage capacitor Cst1. Therefore, a voltage value according to the difference between a data voltage DATAij applied through the data line DLj and a first power voltage is stored in the storage capacitor Cst1. The data voltage DATAij may correspond to one of the reference voltages RV1 to RV255, RV0_1 to RV0_256, GV1 to GV255, GV0_1 to GV_256, BV1 to BV255, and BV0_1 to BV0_256 described with reference to FIG. 1.

The first transistor T1 allows a driving current corresponding to the voltage stored in the storage capacitor Cst1 to flow from the first power line ELVDD to the second power line ELVSS. The light emitting diode LD1 emits light with a luminance corresponding to an amount of the driving current.

Figure 5:
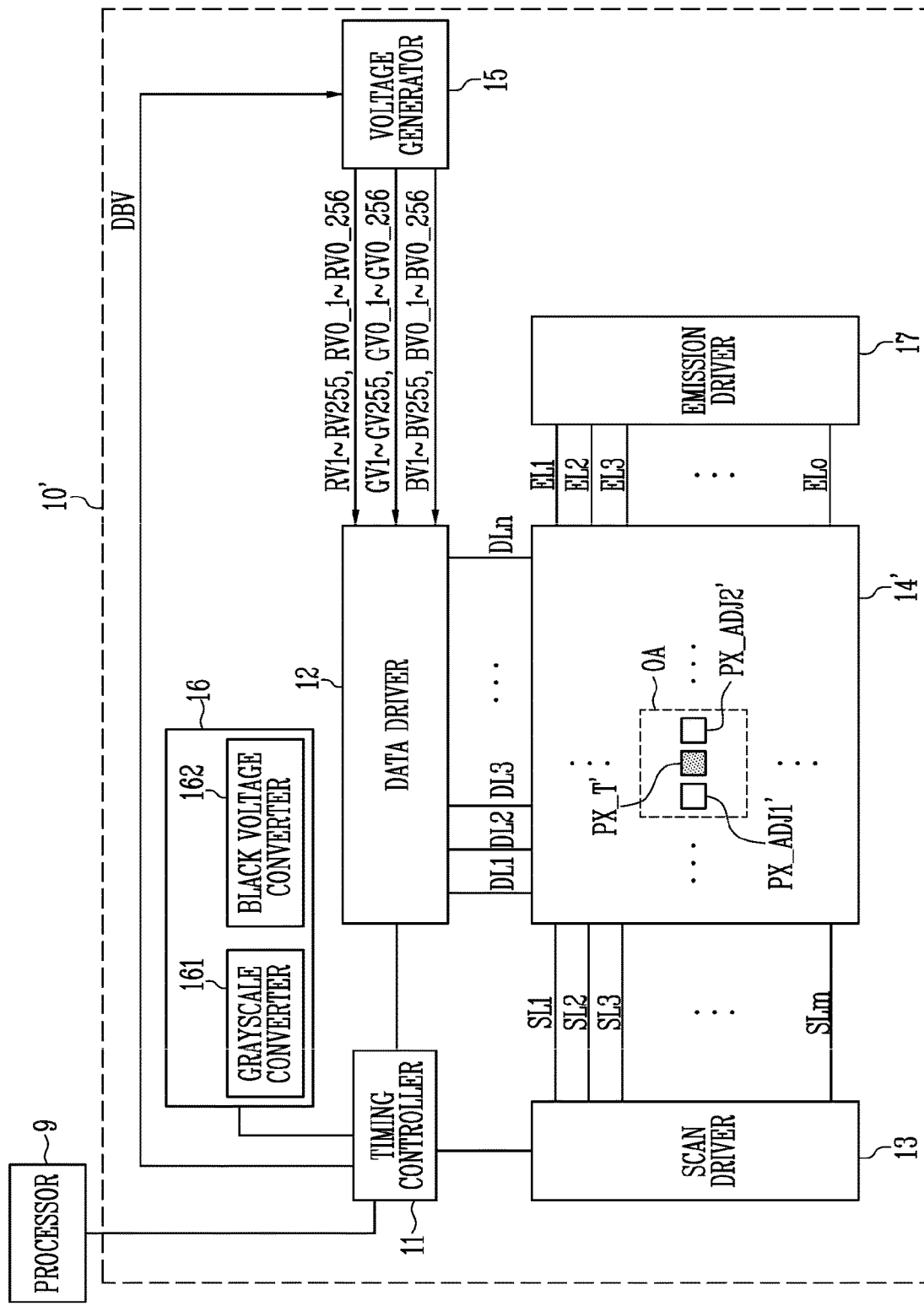
FIG. 5 is a block diagram illustrating an example of the display device shown in FIG. 1.

FIG. 5 is a block diagram illustrating an example of the display device shown in FIG. 1.

Referring to FIGS. 1 and 5, a display device 10' shown in FIG. 5 is different from the display device 10 shown in FIG. 1, in that the display device 10' includes an emission driver 17 and a pixel unit 14'. Except the emission driver 17 and the pixel unit 14', the display device 10' is substantially identical or similar to the display device 10 shown in FIG. 1, and therefore, overlapping descriptions will not be repeated.

The emission driver 17 may receive an emission control signal (e.g., a clock signal and an emission stop signal) from the timing controller 11, generate emission signals, based on the emission control signal, and provide the emission control signal to emission lines EL1, EL2, EL3, . . . , and ELo (o is a positive integer). For example, the emission driver 17 may sequentially provide emission signals having a pulse of a turn-off level to the emission lines EL1, EL2, EL3, . . . , and ELo. For example, the emission driver 17 may be configured in the form of a shift register including a plurality of stage circuits, and generate emission signals in a manner than transfers the emission stop signal in the form of a pulse of a turn-off level from a current stage circuit to a next stage circuit in response to the clock signal.

The pixel circuit 14' may include pixels PX_T', PX_ADJ1', and PX_ADJ2'. Each of the pixels PX_T', PX_ADJ1', and PX_ADJ2' may be connected to a corresponding data line, a corresponding scan line, and a corresponding emission line.

Figure 6:
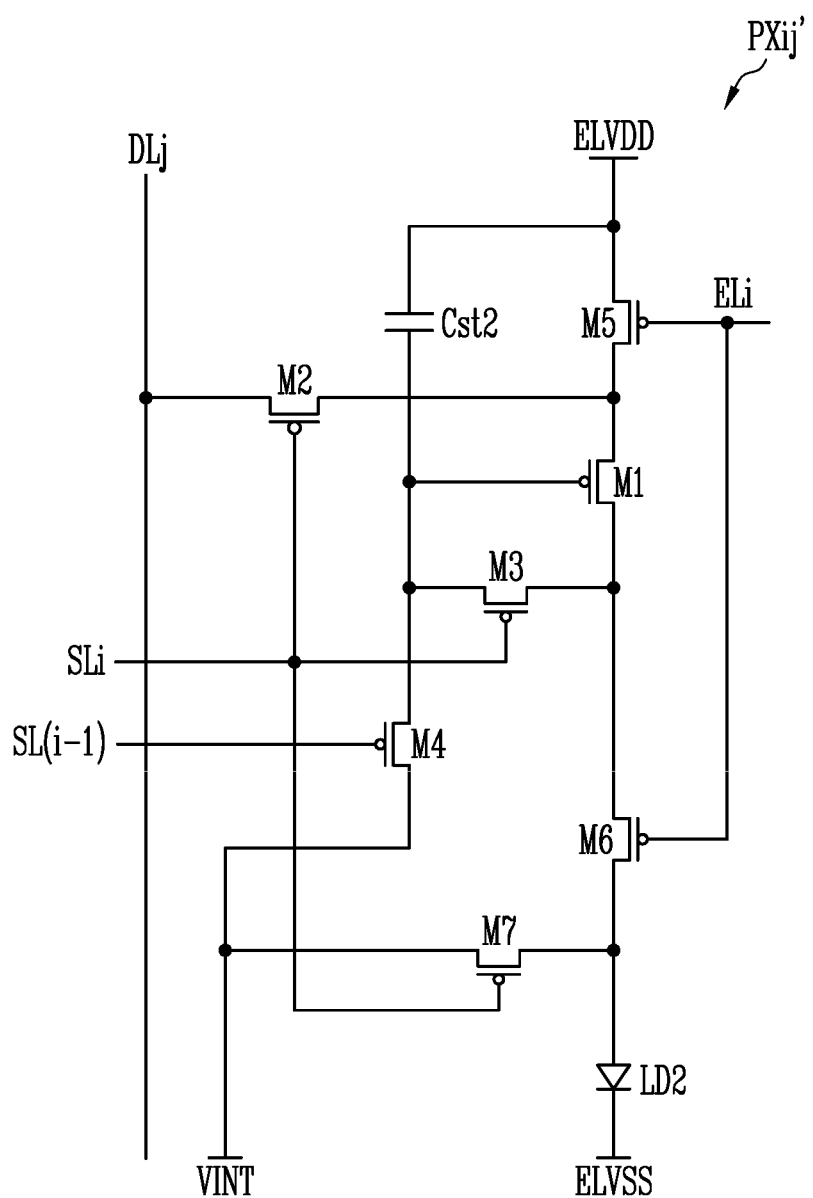
FIG. 6 is a circuit diagram illustrating an example of a pixel included in the display device shown in FIG. 5.

FIG. 6 is a circuit diagram illustrating an example of the pixel included in the display device shown in FIG. 5. The pixels PX_T', PX_ADJ1', and PX_ADJ2' shown in FIG. 5 are substantially identical or similar to one another, and therefore, a pixel PXij' located in an ith pixel row and a jth pixel column will be described in FIG. 6, including the pixels PX_T', PX_ADJ1', and PX_ADJ2'.

Referring to FIG. 6, the pixel PXij' may include thin film transistors M1, M2, M3, M4, M5, M6, and M7, a storage capacitor Cst2, and a light emitting diode LD2.

The storage capacitor Cst2 may be connected or formed between a first power line ELVDD and a gate electrode of a first thin film transistor M1.

A first electrode of the first thin film transistor M1 may be connected to a second electrode of a fifth thin film transistor M5, a second electrode of the first thin film transistor M1 may be connected to a first electrode of a sixth thin film transistor M6, and the gate electrode of the first thin film transistor M1 may be connected to a second electrode of the storage capacitor Cst2. The first thin film transistor M1 may be referred to as a driving transistor. The first thin film transistor M1 may control an amount of driving current flowing between the first power line ELVDD and a second power line ELVSS according to a potential difference between the gate electrode and the first electrode (or source electrode).

A first electrode of a second thin film transistor M2 may be connected to a data line DLj, a second electrode of the second thin film transistor M2 may be connected to the first electrode of the first thin film transistor M1, and a gate electrode of the second thin film transistor M2 may be connected to a current scan line SLi. The second thin film transistor M2 may be referred to as a switching transistor, a scan transistor, etc. The second thin film transistor M2 may allow a data voltage of the data line DLj to be input to the pixel PXij', when a scan signal having a turn-on level is applied to the current scan line SLi.

A first electrode of a third thin film transistor M3 may be connected to the second electrode of the first thin film transistor M1, a second electrode of the third thin film transistor M3 may be connected to the gate electrode of the first thin film transistor M1, and a gate electrode of the third thin film transistor M3 may be connected to the current scan line SLi. The third thin film transistor M3 may allow the first thin film transistor M1 to be diode-connected, when a scan signal having a turn-on level is applied to the current scan line SLi.

A first electrode of a fourth thin film transistor M4 may be connected to the gate electrode of the first thin film transistor M1, a second electrode of the fourth thin film transistor M4 may be connected to an initialization voltage line VINT, and a gate electrode of the fourth thin film transistor M4 may be connected to a previous scan line SL(i−1). The fourth thin film transistor M4 may initialize a charge quantity of the gate electrode of the first thin film transistor M1 by transferring an initialization voltage to the gate electrode of the first thin film transistor M1, when a scan signal having a turn-on level is applied to the previous scan line SL(i−1). According to some example embodiments, the gate electrode of the fourth thin film transistor M4 may be connected to a scan line different from the previous scan line SL(i−1).

A first electrode of the fifth thin film transistor M5 may be connected to the first power line ELVDD, the second electrode of the fifth thin film transistor M5 may be connected to the first electrode of the first thin film transistor M1, and a gate electrode of the fifth thin film transistor M5 may be connected to an emission line ELi. The first electrode of the sixth thin film transistor M6 may be connected to the second electrode of the first thin film transistor M1, a second electrode of the sixth thin film transistor M6 may be connected to an anode electrode of the light emitting diode LD2, and a gate electrode of the sixth thin film transistor M6 may be connected to the emission line ELi. Each of the fifth thin film transistor M5 and the sixth thin film transistor M6 may be referred to as an emission transistor. The fifth thin film transistor M5 and the sixth thin film transistor M6 may form a movement path of driving current between the first power line ELVDD and the second power line ELVSS, when an emission signal having a turn-on level to the emission line ELi. Accordingly, the light emitting diode LD2 may emit light, corresponding to the driving current.

A first electrode of a seventh thin film transistor M7 may be connected to the anode electrode of the light emitting diode LD2, a second electrode of the seventh thin film transistor M7 may be connected to the initialization voltage line VINT, and a gate electrode of the seventh thin film transistor M7 may be connected to the current scan line SLi. The seventh thin film transistor M7 may initialize a charge quantity accumulated in the light emitting diode LD2 by transferring the initialization voltage to the anode electrode of the light emitting diode LD2, when a scan signal having a turn-on level is applied to the current scan line SLi. According to some example embodiments, the gate electrode of the seventh thin film transistor M7 may be connected to a scan line different from the current scan line SLi. For example, the gate electrode of the seventh thin film transistor M7 may be connected to the previous scan line SL(i−1), a previous scan line prior thereto, a next scan line (e.g., an (i+1)th scan line), or a next scan line posterior thereto.

The anode electrode of the light emitting diode LD2 may be connected to the second electrode of the sixth thin film transistor M6, and a cathode electrode of the light emitting diode LD2 may be connected to the second power line ELVSS.

An operation of the pixel PXij will be described with reference to FIG. 7.

Figure 7:
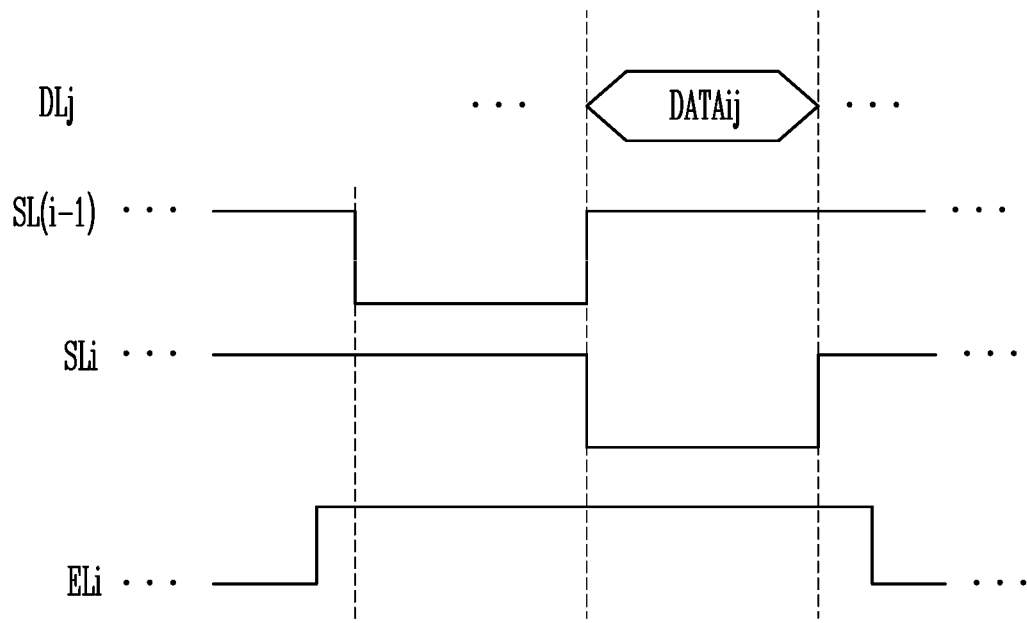
FIG. 7 is a waveform diagram illustrating an operation of the pixel shown in FIG. 6.

FIG. 7 is a waveform diagram illustrating an operation of the pixel shown in FIG. 6.

Referring to FIGS. 6 and 7, a scan signal having a turn-on level (e.g., a low level) may be applied to the previous scan line SL(i−1). The fourth thin film transistor M4 may be turned on, the initialization voltage may be applied to the gate electrode of the first thin film transistor M1, and the charge quantity of the gate electrode of the first thin film transistor M1 may be initialized.

Because an emission signal having a turn-off level is applied to the emission line ELi, the fifth thin film transistor M5 and the sixth thin film transistor M6 may be in a turn-off state, and the light emitting diode LD2 may not emit light in a process of applying the initialization voltage.

Next, a data voltage DATAij with respect to a current pixel row may be applied to the data line DLj, and a scan signal having a turn-on level may be applied to the current scan line SLi. The second thin film transistor M2, the first thin film transistor M1, and the third thin film transistor M3 may be in a conducting state, and the data line DLj and the gate electrode of the first thin film transistor M1 may be electrically connected to each other. Therefore, when the data voltage DATAij is applied to the second electrode of the storage capacitor Cst2, a charge quantity corresponding to the data voltage DATAij and a threshold voltage of the first thin film transistor M1 may be stored in the storage capacitor Cst2.

In addition, the seventh thin film transistor M7 may be turned on in response to the scan signal having the turn-on level, the anode electrode of the light emitting diode LD2 and the initialization voltage line VINT may be connected to each other, and the light emitting diode LD2 may be precharged or initialized with a charge quantity corresponding to the difference between the initialization voltage and a second power voltage.

Subsequently, when an emission signal having a turn-on level is applied to the emission line ELi, the fifth thin film transistor M5 and the sixth thin film transistor M6 may be in the conducting state. The first thin film transistor M1 may provide the light emitting diode LD2 with a driving current corresponding to the charge quantity stored in the storage capacitor Cst2, and the light emitting diode LD2 may emit light with a luminance corresponding to the driving current. The light emitting diode LD2 may emit light until before an emission signal having a turn-off level is applied to the emission line ELi.

As described with reference to FIGS. 5 to 7, the pixel PXij' may further include thin film transistors M3, M4, M5, M6, and M7 for initializing the anode electrode of the light emitting diode LD2, compensating for the data voltage DATAij, or controlling an emission time (or emission duty) of the light emitting diode LD2, in addition to the first thin film transistor M1 (e.g., the driving transistor) and the second thin film transistor M2 (e.g., the switching transistor).

Figure 8:
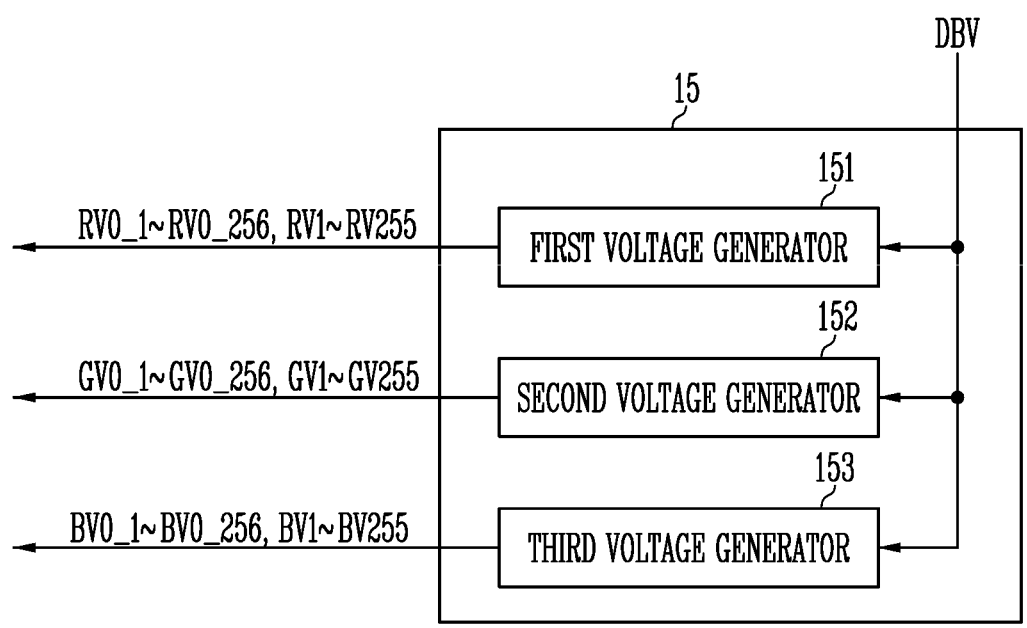
FIG. 8 is a diagram illustrating an example of a voltage generator included in the display device shown in FIG. 1.

FIG. 8 is a diagram illustrating an example of the voltage generator included in the display device shown in FIG. 1.

Referring to FIG. 8, the voltage generator 15 may include a first voltage generator 151 (or first reference voltage generator), a second voltage generator 152 (or second reference voltage generator), and a third voltage generator 153 (or third reference voltage generator).

The first voltage generator 151 may receive the input maximum luminance value DBV, and generate reference voltages RV1 to RV255 and RV0_1 to RV0_256 of first color pixels (e.g., the first color pixels RP22, RP26, RP44, RP62, RP66, and RP84 (see FIG. 2) corresponding to the input maximum luminance value DBV.

Similarly, the second voltage generator 152 may receive the input maximum luminance value DBV, and generate reference voltages GV1 to GV255 and GV0_1 to GV0_256 of second color pixels (e.g., the second color pixels GP11, GP13, GP15, GP17, GP31, GP33, GP35, GP37, GP51, GP53, GP55, GP57, GP71, GP73, GP75, and GP77 (see FIG. 2) corresponding to the input maximum luminance value DBV.

The third voltage generator 153 may receive the input maximum luminance value DBV, and generate reference voltages BV1 to BV255 and BV0_1 to BV0_256 of third color pixels (e.g., the third color pixels BP24, BP42, BP46, BP64, BP82, and BP86 (see FIG. 2) corresponding to the input maximum luminance value DBV.

Figure 9:
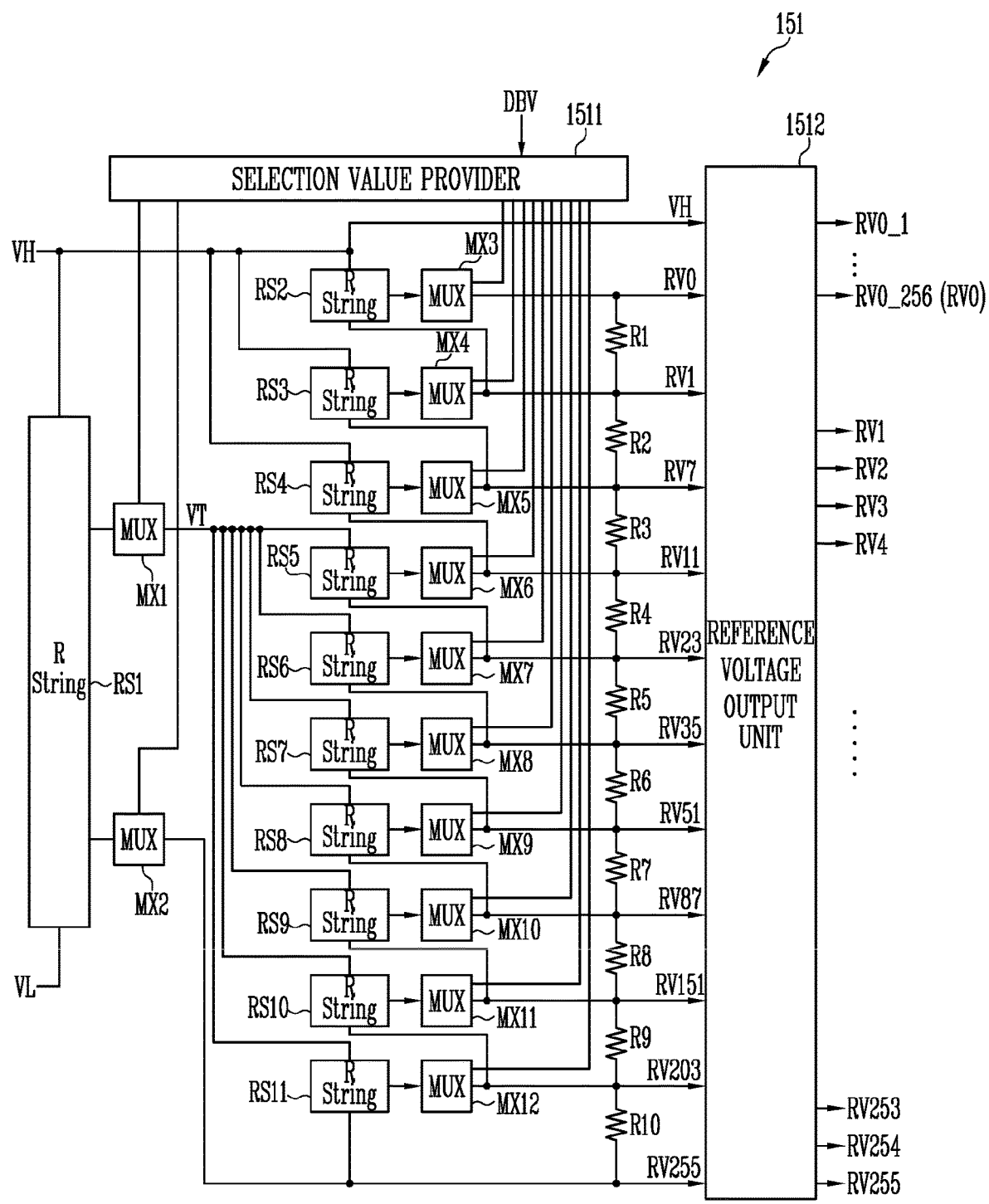
FIG. 9 is a circuit diagram illustrating an example of a first voltage generator included in the voltage generator shown in FIG. 8.

FIG. 9 is a circuit diagram illustrating an example of the first voltage generator included in the voltage generator shown in FIG. 8. The first voltage generator 151, the second voltage generator 152, and the third voltage generator 153, which are shown in FIG. 8, are substantially identical or similar to one another, and therefore, the first voltage generator 151 will be described, including the first voltage generator 151, the second voltage generator 152, and the third voltage generator 153.

Referring to FIG. 9, the first voltage generator 151 may include a selection value provider 1511, a reference voltage output unit 1512, resistor strings RS1 to RS11, multiplexers MX1 to MX12, and resistors R1 to R10.

The selection value provider 1511 may provide selection values of the multiplexers MX1 to MX12 according to the input maximum luminance value DBV. The selection values according to the input maximum luminance value DBV may be pre-stored in a memory device, e.g., a device such as a register. For example, the selection values (or a lookup table including the selection values according to the input maximum luminance value DBV) may be provided together with the input maximum luminance value DBV to the timing controller 11.

A first resistor string RS1 may generate intermediate voltages between a first reference voltage VH and a second reference voltage VL. A first multiplexer MX1 may output a third reference voltage VT by selecting one of the intermediate voltages provided from the first resistor string RS1 according to a selection value. A second multiplexer MX2 may output a 255th reference gamma voltage RV255 by selecting one of the intermediate voltages provided from the first resistor string RS1 according to a selection value.

An eleventh resistor string RS11 may generate intermediate voltages between the third reference voltage VT and the 255th reference gamma voltage RV255. A twelfth multiplexer MX12 may output a 203rd reference gamma voltage RV203 by selecting one of the intermediate voltages provided from the eleventh resistor string RS11 according to a selection value.

A tenth resistor string RS10 may generate intermediate voltages between the third reference voltage VT and the 203rd reference gamma voltage RV203. An eleventh multiplexer MX11 may output a 151st reference gamma voltage RV151 by selecting one of the intermediate voltages provided from the tenth resistor string RS10 according to a selection value.

A ninth resistor string RS9 may generate intermediate voltages between the third reference voltage VT and the 151st reference gamma voltage RV151. A tenth multiplexer MX10 may output an 87th reference gamma voltage RV87 by selecting one of the intermediate voltages provided from the ninth resistor string RS9 according to a selection value.

An eighth resistor string RS8 may generate intermediate voltages between the third reference voltage VT and the 87th reference gamma voltage RV87. A ninth multiplexer MX9 may output a 51st reference gamma voltage RV51 by selecting one of the intermediate voltages provided from the eighth resistor string RS8 according to a selection value.

A seventh resistor string RS7 may generate intermediate voltages between the third reference voltage VT and the 51st reference gamma voltage RV51. An eighth multiplexer MX8 may output a 35th reference gamma voltage RV35 by selecting one of the intermediate voltages provided from the seventh resistor string RS7 according to a selection value.

A sixth resistor string RS6 may generate intermediate voltages between the third reference voltage VT and the 35th reference gamma voltage RV35. A seventh multiplexer MX7 may output a 23rd reference gamma voltage RV23 by selecting one of the intermediate voltages provided from the sixth resistor string RS6 according to a selection value.

A fifth resistor string RS5 may generate intermediate voltages between the third reference voltage VT and the 23rd reference gamma voltage RV23. A sixth multiplexer MX6 may output an 11th reference gamma voltage RV11 by selecting one of the intermediate voltages provided from the fifth resistor string RS5 according to a selection value.

A fourth resistor string RS4 may generate intermediate voltages between the first reference voltage VH and the 11th reference gamma voltage RV11. A fifth multiplexer MX5 may output a 7th reference gamma voltage RV7 by selecting one of the intermediate voltages provided from the fourth resistor string RS4 according to a selection value.

A third resistor string RS3 may generate intermediate voltages between the first reference voltage VH and the 7th reference gamma voltage RV7. A fourth multiplexer MX4 may output a 1st reference gamma voltage RV1 by selecting one of the intermediate voltages provided from the third resistor string RS3 according to a selection value.

A second resistor string RS2 may generate intermediate voltages between the first reference voltage VH and the 1st reference gamma voltage RV1. A third multiplexer MX3 may output a 0th reference gamma voltage RV0 by selecting one of the intermediate voltages provided from the second resistor string RS2 according to a selection value.

Grayscales corresponding to the 0th, 1st, 7th, 11th, 23rd, 35th, 51st, 87th, 151st, 203rd, and 255th reference gamma voltages RV0, RV1, RV7, RV11, RV23, RV35, RV51, RV87, RV151, RV203, and RV255 may be designated as representative grayscales. In addition, the reference gamma voltages RV0, RV1, RV7, RV11, RV23, RV35, RV51, RV87, RV151, RV203, and RV255 output from the multiplexers MX2 to MX12 may be designated as representative gamma voltages. A number of representative grayscales and grayscale numbers corresponding to the representative grayscales may be differently set depending on the display device 10 (see FIG. 1).

The reference voltage output unit 1512 may reference gamma voltages RV1 to RV255 and reference black voltages RV0_1 to RV0_256 by dividing the first reference voltage VH and the 0th, 1st, 7th, 11th, 23rd, 35th, 51st, 87th, 151st, 203rd, and 255th reference gamma voltages RV0, RV1, RV7, RV11, RV23, RV35, RV51, RV87, RV151, RV203, and RV255. For example, the reference voltage output unit 1512 may generate second to sixth reference gamma voltages RV2 to RV6 by dividing the 1st and 7th reference gamma voltages RV1 and RV7. For example, the reference voltage output unit 1512 may generate 1st to 256th reference black voltages RV0_1 to RV0_256 by dividing the first reference voltage VH and the 0th reference gamma voltage RV0.

As described with reference to FIG. 9, the first voltage generator 151 can generate a plurality of reference black voltages RV0_1 to RV0_256 in addition to the reference gamma voltages RV1 to RV255.

Figure 10:
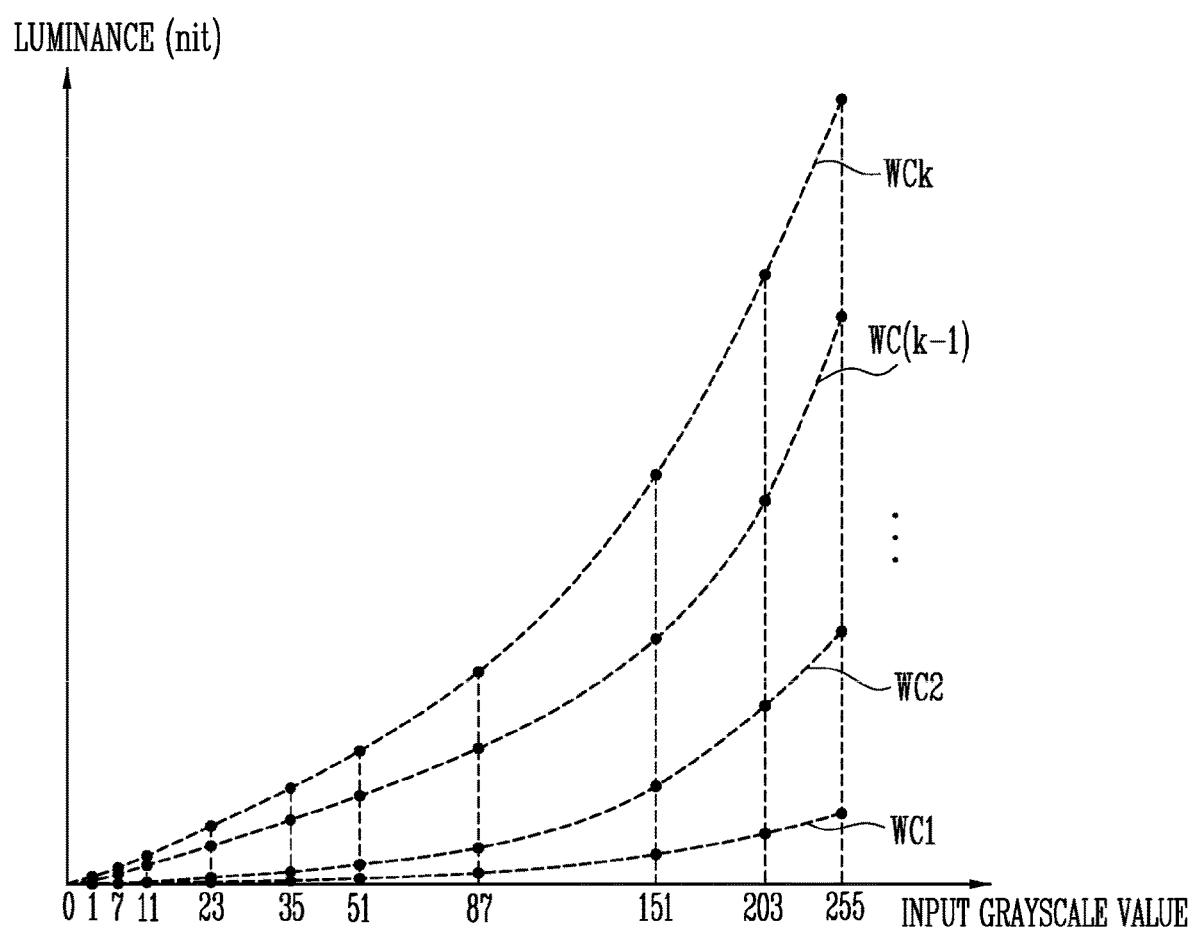
FIG. 10 is a diagram illustrating luminance curves of white color light according to a maximum luminance value.

FIG. 10 is a diagram illustrating luminance curves of white color light according to a maximum luminance value.

Referring to FIG. 10, each of luminance curves WC1, WC2, . . . , WC(k−1), and WCk (k is a positive integer) (or reference luminance curves) represents a luminance according to an input grayscale value.

Maximum luminance values of the luminance curves WC1, WC2, . . . , WC(k−1), and WCk may be different from one another. For example, a maximum luminance (e.g., 4 nits) of a first luminance curve WC1 may be lowest, and a maximum luminance value (e.g., 1200 nits) of a kth luminance curve WCk may be highest.

Meanwhile, in order to generate white color light, it is assumed that data voltages with respect to the same grayscale are provided to the pixels of the pixel unit 14 (see FIG. 1).

Imaginary dots on the luminance curves WC1, WC2, . . . , WC(k−1), and WCk may correspond to selection values pre-stored in selection value provider 1511 described with reference to FIG. 9. More accurate white luminance curves may be directly expressed as a number of selection values is increased. However, physical devices such as multiplexers, registers, etc. are further required corresponding to the increased number of selection values, and therefore, there is a limitation in the number of selection values. Accordingly, the selection values with respect to some reference gamma voltages (e.g., reference gamma voltages with respect to representative grayscales) described with reference to FIG. 9 may be pre-stored and used, and the other reference voltages may be generated by dividing the some reference gamma voltages. In addition, for the same reason, selection values with respect to some maximum luminance values (e.g., reference maximum luminance values) between 4 nits and 1200 nits may be pre-stored and used, and the other maximum luminance values may be generated by interpolating the pre-stored selection values.

The pre-stored selection values may be set for each display device 10 through Multi-Time Programming (MTP). That is, selection values may be set through repetitive measurements to be stored in the display device 10, so that white color light with a desired luminance can be emitted with respect to grayscale values.

As described above, the pre-stored selection values may be values set with respect to the white color light. When mixed color light or single color light is emitted by using the set reference gamma voltages, the luminance of the mixed color light or single color light may not accurately accord with a desired luminance curve (or gamma curve. In addition, when an error occurs in a luminance curve of the single color light, a color coordinate of the mixed color light or single color light may not accord with a desired color coordinate.

An error of the luminance curve of single color light with respect to the luminance curve of white color light will be described with reference to FIG. 11.

Figure 11:
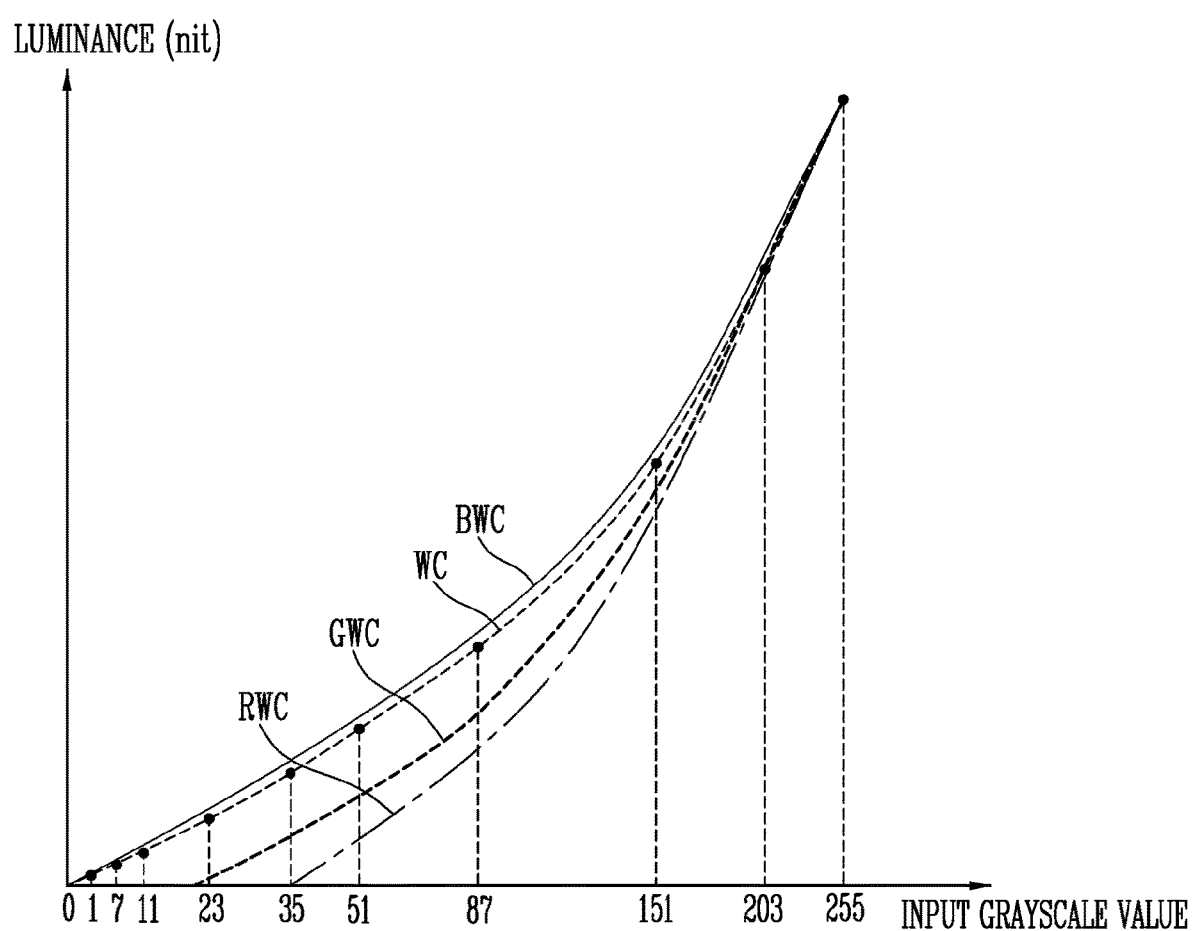
FIG. 11 is a diagram illustrating luminance curves of white color light and single color light.

FIG. 11 is a diagram illustrating luminance curves of white color light and single color light.

Referring to FIG. 11, a first color luminance curve RWC represents a luminance curve of light of a first color (e.g., red), a second color luminance curve GWC represents a luminance curve of light of a second color (e.g., green), and a third color luminance curve BWC represent a luminance curve of light of a third color (e.g., blue).

A gamma curve may be generally expressed as shown in the following Equation 1.

$$y = ax^{GM} + b \quad \text{Equation 1}$$

Here, x is an input grayscale value, y is a luminance value, each of a and b is an arbitrary constant, and GM is a gamma value.

Hereinafter, for convenience of description, the constants a and b are neglected, and shapes of luminance curves are described by using the gamma value GM. When the gamma value corresponds to 1, the luminance curve may have the shape of a straight line instead of a curve is drawn. When the gamma value is greater than 1, the luminance curve may have a shape convex to be adjacent to a horizontal axis.

A gamma value of the first color luminance curve RWC may be greater than that of a luminance curve WC (e.g., the luminance curve of white color light). In addition, a gamma value of the second color luminance curve GWC may be greater than that of the luminance curve WC and be smaller than that of the first color luminance curve RWC. In addition, a gamma value of the third color luminance curve BWC may be smaller than or similar to that of the luminance curve WC.

Therefore, the display device 10 (see FIG. 1) in accordance with the embodiments of the present disclosure may compensate for an input grayscale value such that a pixel emits light with the same luminance when the display device 10 emits single color light and when the display device 10 emits white color light. Also, the display device 10 may vary a data voltage (e.g., a black voltage) corresponding to the minimum grayscale so as to prevent or reduce a luminance change (or color coordinate change) caused by side leakage.

For example, the display device 10 may determine whether each of the unit areas emits single color light, double mixed color light, triple mixed color light, or white color light, may correct the input grayscale value, and may adjust the black voltage provided to a pixel which does not emit light (or to a non-emission pixel).

An example will be described with reference to FIG. 11. The display device 10 corrects the input grayscale value, so that the gamma value of the first color luminance curve RWC can be decreased. Accordingly, the first color luminance curve RWC can be corrected to be similar to the luminance curve WC.

Similarly, the display device 10 corrects the input grayscale value, so that the gamma value of the second color luminance curve GWC can be decreased. Accordingly, the second color luminance curve GWC can be corrected to be similar to the luminance curve WC. A decrement of the gamma value of the second color luminance curve GWC may be smaller than that of the gamma value of the first color luminance curve RWC.

The display device 10 corrects the input grayscale value, so that the gamma value of the third color luminance curve BWC can be increased. Accordingly, the third color luminance curve BWC can be corrected to be similar to the luminance curve WC.

Thus, luminances of single color lights can be accurately expressed according a desired gamma curve. Further, in a low grayscale area, a luminance change amount according to the input grayscale value increases, so that low grayscale expression can be further clarified.

The correction of the input grayscale value may be equally applied to the cases of double mixed color light and triple mixed color light. Thus, the display device 10 corrects the input grayscale value, so that the double mixed color light curve can be corrected to be similar to the luminance curve WC. In addition, the display device 10 corrects the input grayscale value, so that the triple mixed color light curve can be corrected to be similar to the luminance curve WC.

However, in the case of the white color light, the selection values have already been set suitable for the white color light, and thus it is unnecessary to separately perform grayscale correction.

Figure 12:
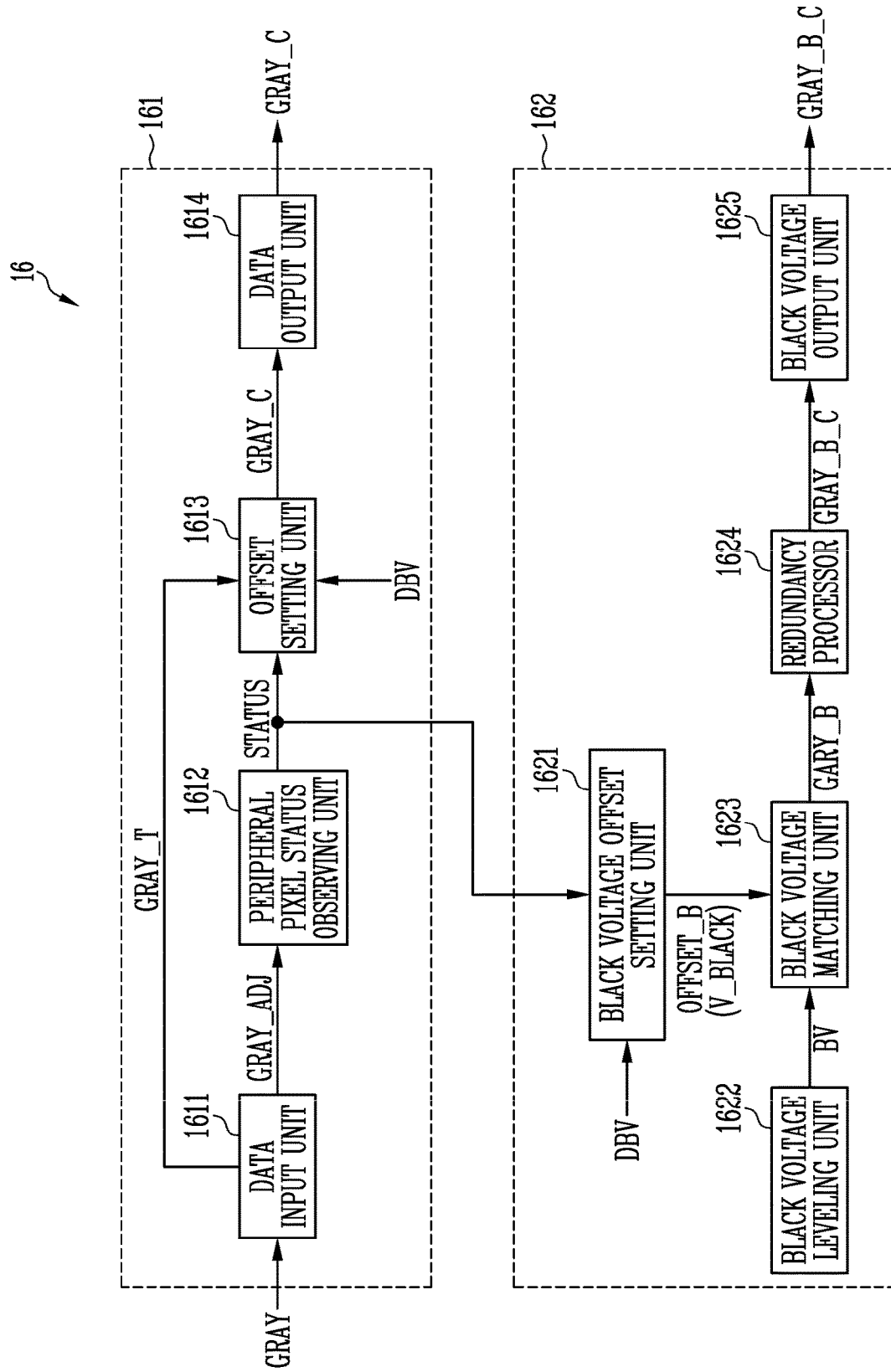
FIG. 12 is a block diagram illustrating an example of a converter included in the display device shown in FIG. 1.

FIG. 12 is a block diagram illustrating an example of the converter included in the display device shown in FIG. 1.

Referring to FIGS. 1 and 12, the converter 16 may include a grayscale converter 161 and a black voltage converter 162.

The grayscale converter 161 may include a data input unit 1611, a peripheral pixel status observing unit 1612, an offset setting unit 1613, and a data output unit 1614.

The data input unit 1611 may receive grayscale values GRAY (or input image data), and extract grayscale values, e.g., observation grayscale values GRAY_ADJ of the peripheral pixels PX_ADJ1 and PX_ADJ2 in the unit area OA.

The data input unit 1611 may sequentially extract and output observation grayscale values GRAY_ADJ corresponding to the unit areas ORA, OGA, and OBA described with reference to FIG. 2.

The peripheral pixel status observing unit 1612 may determine light emission statuses of the peripheral pixels PX_ADJ1 and PX_ADJ2, respectively based on the observation grayscale values GRAY_ADJ. Also, the peripheral pixel status observing unit 1612 may determine whether a color displayed by the unit area OA is a single color, a double mixed color, or a triple mixed color, based on the light emission statuses of the peripheral pixels PX_ADJ1 and PX_ADJ2.

For example, the peripheral pixel status observing unit 1612 may determine whether a first observation grayscale value among the observation grayscale values GRAY_ADj is greater than a reference grayscale value (e.g., a grayscale value of 0). When the first observation grayscale value is greater than the reference grayscale value, the peripheral pixel status observing unit 1612 may determine that a corresponding peripheral pixel emits light (or is in a light emission status). When the first observation grayscale value is smaller than or equal to the reference grayscale value, the peripheral pixel status observing unit 1612 may determine that the corresponding peripheral pixel does not emit light (or is in a non-light emission status). For example, the peripheral pixel status observing unit 1612 may calculate a number of light emitting pixels for each color.

Accordingly, the peripheral pixel status observing unit 1612 may divide a light emission status of the first unit area ORA (or peripheral pixels in the first unit area ORA) described with reference to FIG. 2 into 25 cases, divide a light emission status of the second unit area OGA into 9 cases, and divide a light emission status of the third unit area OBA into 25 cases. The peripheral pixel status observing unit 1612 may output status information representing a case corresponding to each of the unit areas ORA, OGA, and OBA.

Light emission statuses of the unit areas ORA, OGA, and OBA will be described with reference to FIGS. 13 to 15. After the light emission statuses of the unit areas ORA, OGA, and OBA are described with reference to FIGS. 13 to 15, the offset setting unit 1613, the data output unit 1614, and the black voltage converter 162 will be described.

Figure 13:
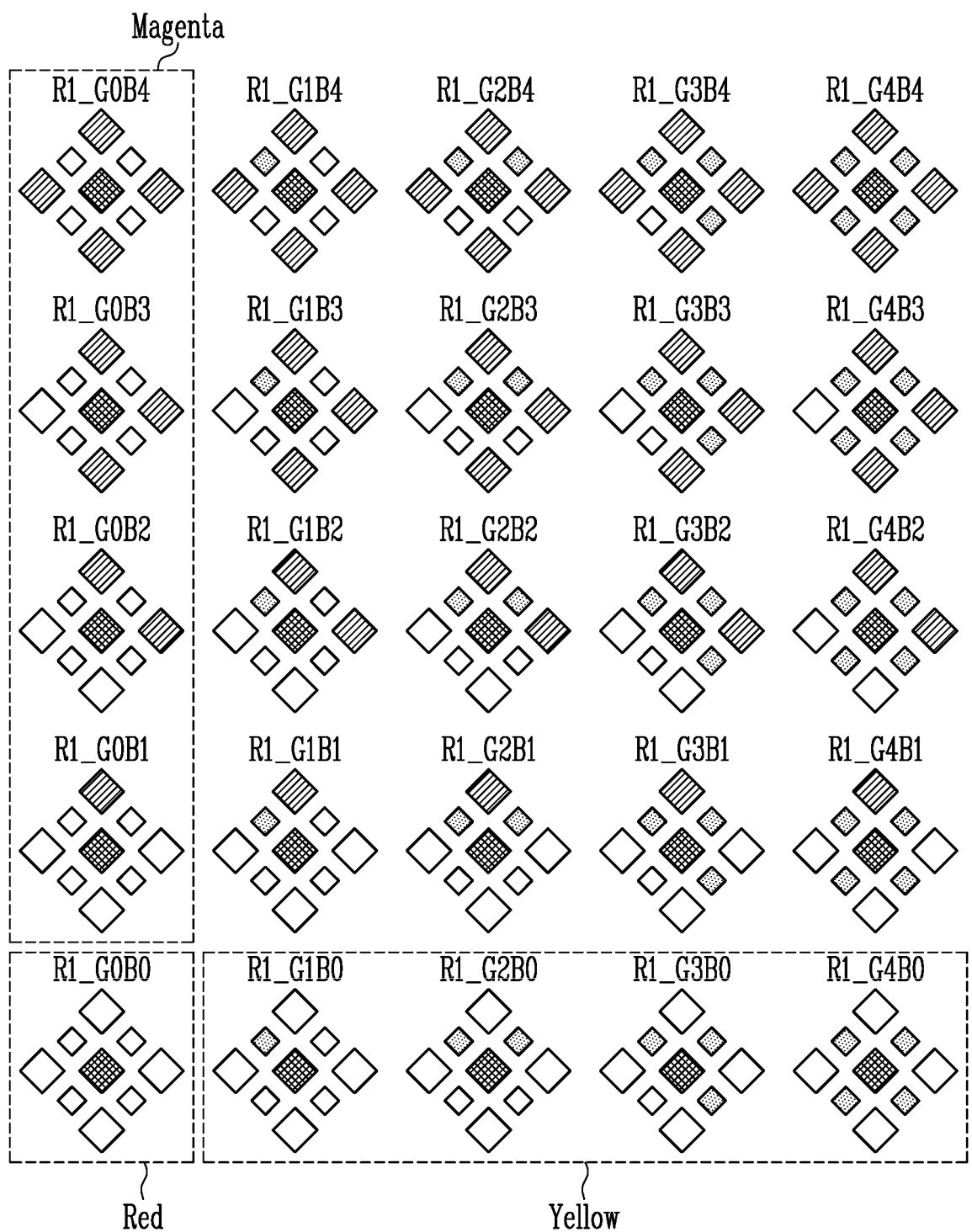
FIG. 13 is a diagram illustrating various examples of light emission statuses of pixels with respect to a first unit area.

FIG. 13 is a diagram illustrating various examples of light emission statuses of pixels with respect to the first unit area. In FIG. 13, there are illustrated 25 cases for light emission statuses of peripheral pixels (e.g., the twenty-fourth pixel BP24, the thirty-third pixel GP33, the thirty-fifth pixel GP35, the forty-second pixel BP42, the forty-sixth pixel BP46, the fifty-third pixel GP53, the fifty-fifth pixel GP55, and the sixty-fourth pixel BP64) in the first unit area ORA shown in FIG. 2, which are set with reference to the first unit area ORA (e.g., the forty-fourth pixel RP44). A case where a pixel emitting light among the peripheral pixels (e.g., the twenty-fourth pixel BP24, the thirty-third pixel GP33, the thirty-fifth pixel GP35, the forty-second pixel BP42, the forty-sixth pixel BP46, the fifty-third pixel GP53, the fifty-fifth pixel GP55, and the sixty-fourth pixel BP64) includes a pattern is illustrated, and a case where a pixel which does not emit light among the peripheral pixels (e.g., the twenty-fourth pixel BP24, the thirty-third pixel GP33, the thirty-fifth pixel GP35, the forty-second pixel BP42, the forty-sixth pixel BP46, the fifty-third pixel GP53, the fifty-fifth pixel GP55, and the sixty-fourth pixel BP64) does not include any pattern is illustrated.

Referring to FIGS. 12 and 13, in an eleventh case R1_G0B4, all the second color pixels (e.g., the thirty-third pixel GP33, the thirty-fifth pixel GP35, the fifty-third pixel GP53, and the fifty-fifth pixel GP55) may be in the non-light emission status, and all the third color pixels (e.g., the twenty-fourth pixel BP24, the forty-second pixel BP42, the forty-sixth pixel BP46, and the sixty-fourth pixel BP64) may be in the light emission status. That is, a light emission number of the second color pixels may be 0, and a light emission number of the third color pixels may be 4.

In a twelfth case R1_G1B4, only one pixel (e.g., the thirty-third pixel GP33) among the second color pixels (e.g., the thirty-third pixel GP33, the thirty-fifth pixel GP35, the fifty-third pixel GP53, and the fifty-fifth pixel GP55) may be in the light emission status, and all the third color pixels may be in the light emission status. That is, a light emission number of the second color pixels (e.g., a number of pixels emitting light) may be 1, and a light emission number of the third color pixels may be 4.

In a thirteenth case R1_G2B4, only two pixels (e.g., the thirty-third pixel GP33 and the thirty-fifth pixel GP35) among the second color pixels (e.g., the thirty-third pixel GP33, the thirty-fifth pixel GP35, the fifty-third pixel GP53, and the fifty-fifth pixel GP55) may be in the light emission status, and all the third color pixels may be in the light emission status. That is, a light emission number of the second color pixels may be 2, and a light emission number of the third color pixels may be 4.

In a fourteenth case R1_G3B4, a light emission number of the second color pixels may be 3, and a light emission number of the third color pixels may be 4.

In a fifteenth case R1_G4B4, a light emission number of the second color pixels may be 4, and a light emission number of the third color pixels may be 4.

Similarly, in a twenty-first case R1_G0B3, a twenty-second case R1_G1B3, a twenty-third case R1_G2B3, a twenty-fourth case R1_G3B3, and a twenty-fifth case R1_G4B3, which are located in a second row, a light emission number of the third color pixels may be 3, and light emission numbers of the second color pixels may be respectively 0, 1, 2, 3, and 4.

In a thirty-first case R1_G0B2, a thirty-second case R1_G1B2, a thirty-third case R1_G2B2, a thirty-fourth case R1_G3B2, and a thirty-fifth case R1_G4B2, which are located in a third row, a light emission number of the third color pixels may be 2, and light emission numbers of the second color pixels may be respectively 0, 1, 2, 3, and 4.

In a forty-first case R1_G0B1, a forty-second case R1_G1B1, a forty-third case R1_G2B1, a forty-fourth case R1_G3B1, and a forty-fifth case R1_G4B1, which are located in a fourth row, a light emission number of the third color pixels may be 1, and light emission numbers of the second color pixels may be respectively 0, 1, 2, 3, and 4.

In a fifty-first case R1_G0B0, a fifty-second case R1_G1B0, a fifty-third case R1_G2B0, a fifty-fourth case R1_G3B0, and a fifty-fifth case R1_G4B0, which are located in a fifth row, a light emission number of the third color pixels may be 0, and light emission numbers of the second color pixels may be respectively 0, 1, 2, 3, and 4.

In the fifty-first case R1_G0B0 located in a first column and the fifth row, a single color may be displayed in the first unit area ORA. For example, red may be displayed in the first unit area ORA.

In the eleventh case R1_G0B4, the twenty-first case R1_G0B3, the thirty-first case R1_G0B2, and the forty-first case R1_G0B1, which are included in the first column, a double mixed color (e.g., a mixed color of the first color and the third color) may be displayed in the first unit area ORA. For example, magenta may be displayed in the first unit area ORA.

In the fifty-second case R1_G1B0, the fifty-third case R1_G2B0, the fifty-fourth case R1_G3B0, and the fifty-fifth case R1_G4B0, which are included in the fifth row, a double mixed color (e.g., a mixed color of the first color and the second color) may be displayed in the first unit area ORA. For example, yellow may be displayed in the first unit area ORA.

In cases included in portions at which the first to fourth rows and second to fifth columns intersect each other, a triple mixed color or white color may be displayed in the first unit area ORA.

Figure 14:
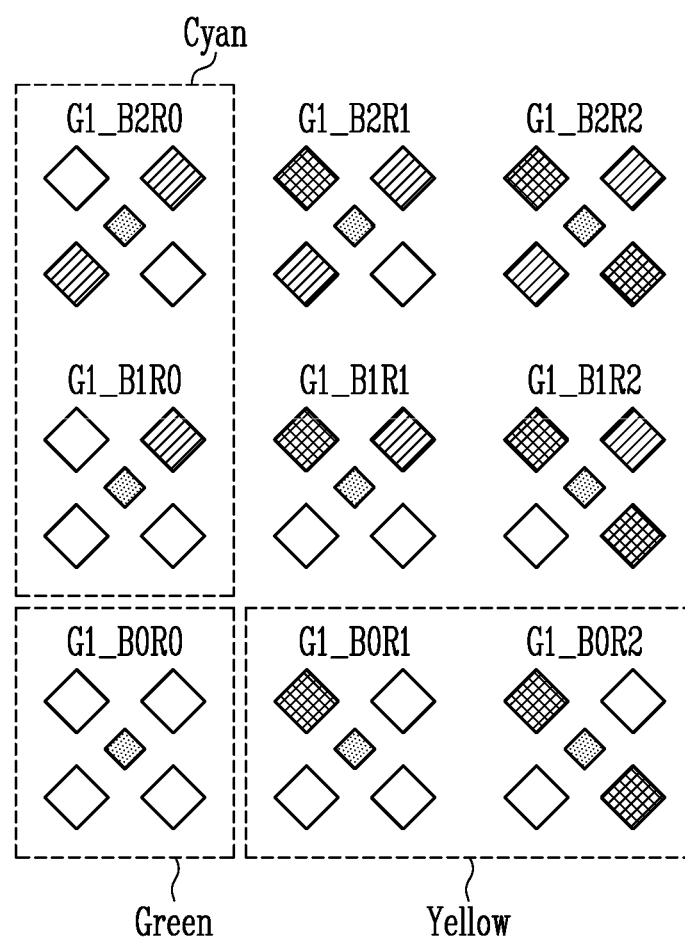
FIG. 14 is a diagram illustrating various examples of light emission statuses of pixels with respect to a second unit area.

FIG. 14 is a diagram illustrating various examples of light emission statuses of pixels with respect to the second unit area. In FIG. 14, there are illustrated 9 cases for light emission statuses of peripheral pixels (e.g., the forty-fourth pixel RP44, the forty-sixth pixel BP46, the sixty-fourth pixel BP64, and the sixty-sixth pixel RP66) in the second unit area OGA shown in FIG. 2, which are set with reference to the second unit area OGA (e.g., the fifty-fifth pixel GP55).

Referring to FIGS. 12 and 14, in an eleventh case G1_B2R0, all the third color pixels (e.g., the forty-sixth pixel BP46 and the sixty-fourth pixel BP64) may be in the light emission status, and all the first color pixels (e.g., the forty-fourth pixel RP44 and the sixty-sixth pixel RP66) may be in the non-light emission status. That is, a light emission number of the third color pixels may be 2, and a light emission number of the first color pixels may be 0.

In a twelfth case G1_B2R1, all the third color pixels may be in the light emission status, and only one pixel (e.g., the forty-fourth pixel RP44) among the first color pixels (e.g., the forty-fourth pixel RP44 and the sixty-sixth pixel RP66) may be in the light emission status. That is, a light emission number of the third color pixels may be 2, and a light emission number of the first color pixels may be 1.

In a thirteenth case G1_B2R2, all the third color pixels may be in the light emission status, and all the first color pixels may be in the light emission status. That is, a light emission number of the third color pixels may be 2, and a light emission number of the first color pixels may be 2.

Similarly, in a twenty-first case G1_B1R0, a twenty-second case G1_B1R1, and a twenty-third case G1_B1R2, which are located in a second row, a light emission number of the third color pixels may be 1, and light emission numbers of the first color pixels may be respectively 0, 1, and 2.

In a thirty-first case G1_B0R0, a thirty-second case G1_B0R1, and a thirty-third case G1_B0R2, which are located in a third row, a light emission number of the third color pixels may be 0, and light emission numbers of the first color pixels may be respectively 0, 1, and 2.

In the thirty-first case G1_B0R0 located in a first column and the third row, a single color may be displayed in the second unit area OGA. For example, green may be displayed in the second unit area OGA.

In the eleventh case G1_B2R0 and the twenty-first case G1_B1R0, which are included in the first column, a double mixed color (e.g., a mixed color of the second color and the third color) may be displayed in the second unit area OGA. For example, cyan may be displayed in the second unit area OGA.

In the thirty-second case G1_B0R1 and the thirty-third case G1_B0R2, which are included in the third row, a double mixed color (e.g., a mixed color of the second color and the first color) may be displayed in the second unit area OGA. For example, yellow may be displayed in the second unit area OGA Meanwhile, in cases included in portions at which the first and second rows and second and third columns intersect each other, a triple mixed color or white color may be displayed in the second unit area OGA.

Figure 15:
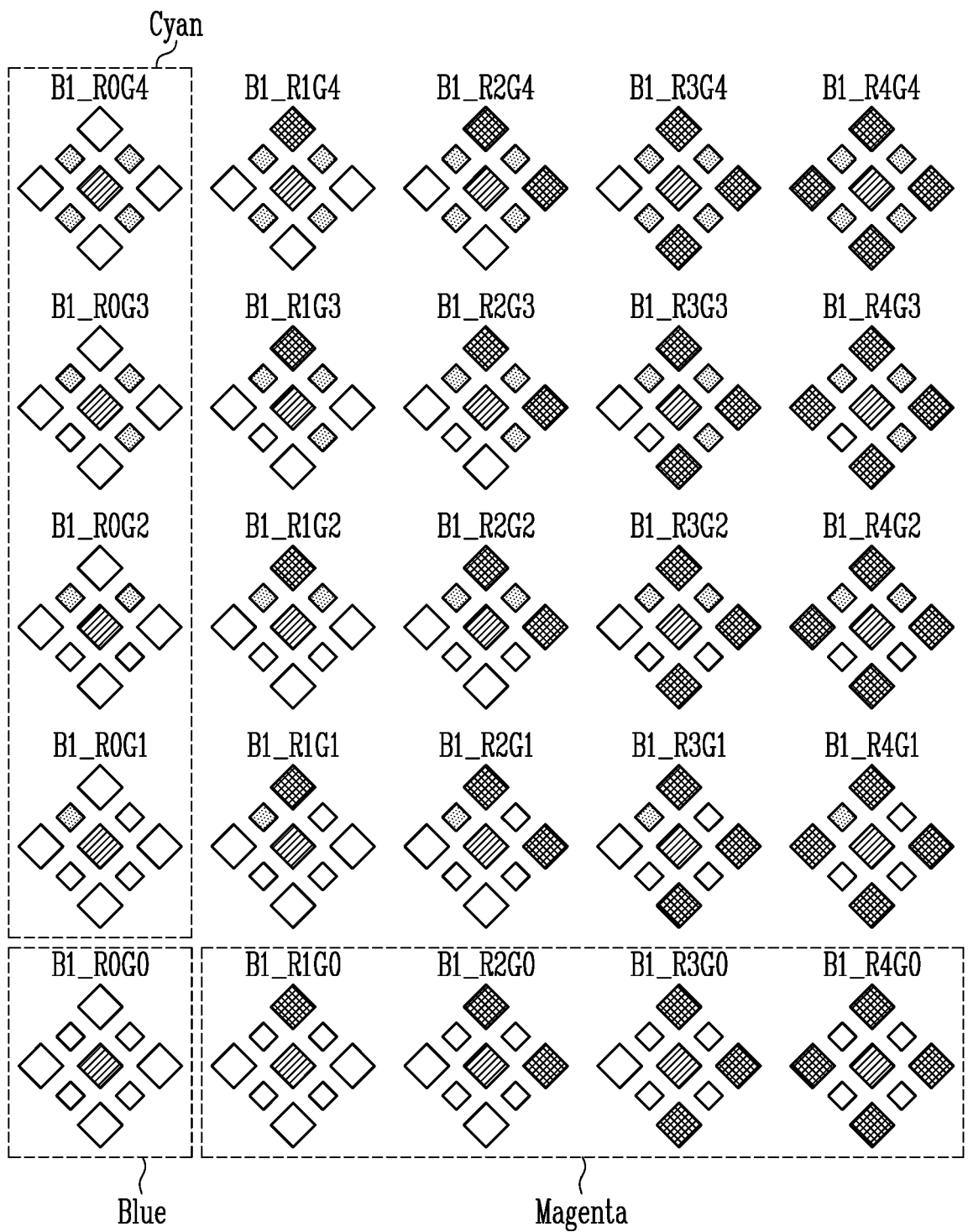
FIG. 15 is a diagram illustrating various examples of light emission statuses of pixels with respect to a third unit area.

FIG. 15 is a diagram illustrating various examples of light emission statuses of pixels with respect to a third unit area. In FIG. 15, there are illustrated 25 cases for light emission statuses of peripheral pixels (e.g., the forty-fourth pixel RP44, the fifty-third pixel GP53, the fifty-fifth pixel GP55, the sixty-second pixel RP62, the sixty-sixth pixel RP66, the seventy-third pixel GP73, the seventy-fifth pixel GP75, and the eighty-fourth pixel RP84) in the third unit area OBA shown in FIG. 2, which are set with respect to the third unit area OBA (e.g., the sixty-fourth pixel BP64).

Referring to FIGS. 12 and 15, in an eleventh case B1_R0G4, all the first color pixels (e.g., the forty-fourth pixel RP44, the sixty-second pixel RP62, the sixty-sixth pixel RP66, and the eighty-fourth pixel RP84) may be in the light emission status. That is, a light emission number of the first color pixels may be 0, and a light emission number of the second color pixels may be 4.

In a twelfth case B1_R1G4, only one pixel (e.g., the forty-fourth pixel RP44) among the first color pixels may be in the light emission status, and all the second color pixels may be in the light emission status. That is, a light emission number of the first color pixels may be 1, and a light emission number of the second color pixels may be 4.

In a thirteenth case B1_R2G4, only two pixels (e.g., the forty-fourth pixel RP44 and the sixty-sixth pixel RP66) among the first color pixels may be in the light emission status, and all the second color pixels may be in the light emission status. That is, a light emission number of the first color pixels may be 2, and a light emission number of the second color pixels may be 4.

In a fourteenth case B1_R3G4, a light emission number of the first color pixels may be 3, and a light emission number of the second color pixels may be 4.

In a fifteenth case B1_R4G4, a light emission number of the first color pixels may be 4, and a light emission number of the second color pixels may be 4.

Similarly, in a twenty-first case B1_R0G3, a twenty-second case B1_R1G3, a twenty-third case B1_R2G3, a twenty-fourth case B1_R3G3, and a twenty-fifth case B1_R4G3, which are located in a second row, a light emission number of the second color pixels may be 3, and light emission numbers of the first color pixels may be respectively 0, 1, 2, 3, and 4.

In a thirty-first case B1_R0G2, a thirty-second case B1_R1G2, a thirty-third case B1_R2G2, a thirty-fourth case B1_R3G2, and a thirty-fifth case B1_R4G2, which are located in a third row, a light emission number of the second color pixels may be 2, and light emission numbers of the first color pixels may be respectively 0, 1, 2, 3, and 4.

In a forty-first case B1_R0G1, a forty-second case B1_R1G1, a forty-third case B1_R2G1, a forty-fourth case B1_R3G1, and a forty-fifth case B1_R4G2, which are located in a fourth row, a light emission number of the second color pixels may be 1, and light emission numbers of the first color pixels may be respectively 0, 1, 2, 3, and 4.

In a fifty-first case B1_R0G0, a fifty-second case B1_R1G0, a fifty-third case B1_R2G0, a fifty-fourth case B1_R3G0, and a fifty-fifth case B1_R4G0, which are located in a fifth row, a light emission number of the second color pixels may be 0, and light emission numbers of the first color pixels may be respectively 0, 1, 2, 3, and 4.

In the fifty-first case B1_R0G0 located in a first column and the fifth row, a single color may be displayed in the third unit area OBA. For example, blue may be displayed in the third unit area OBA.

In the eleventh case B1_R0G4, the twenty-first case B1_R0G3, the thirty-first case B1_R0G2, and the forty-first case B1_R0G1, which are included in the first column, a double mixed color (e.g., a mixed color of the second color and the third color) may be displayed in the third unit area OBA. For example, cyan may be displayed in the third unit area OBA.

In the fifty-second case B1_R1G0, the fifty-third case B1_R2G0, the fifty-fourth case B1_R3G0, and the fifty-fifth case B1_R4G0, which are included in the fifth row, a double mixed color (e.g., a mixed color of the first color and the third color) may be displayed in the third unit area OBA. For example, magenta may be displayed in the third unit area OBA.

In cases included in portions at which the first to fourth rows and second to fifth columns intersect each other, a triple mixed color or white color may be displayed in the third unit area OBA.

As described with reference to FIGS. 13 to 15, the peripheral pixel status observing unit 1612 may count a number of light emitting pixels for each color in each of the unit areas ORA, OGA, and OBA described with reference to FIG. 2, and divide the light emission status of each of the unit areas ORA, OGA, and OBA into 25 or 9 cases (e.g., a total of 59 cases). Also, the peripheral pixel status observing unit 1612 may determine a color displayed in a corresponding unit area as one of a single color, a double mixed color, and a triple mixed color.

Referring back to FIGS. 1 and 12, the offset setting unit 1613 may generate a corrected grayscale value by correcting input grayscale values of the target pixel PX_T, based on the status information STATUS (e.g., the light emission statuses of the peripheral pixels PX_ADJ1 and PXADJ2.

The offset setting unit 1613 will be described with reference to FIGS. 16 to 18.

Figure 16:
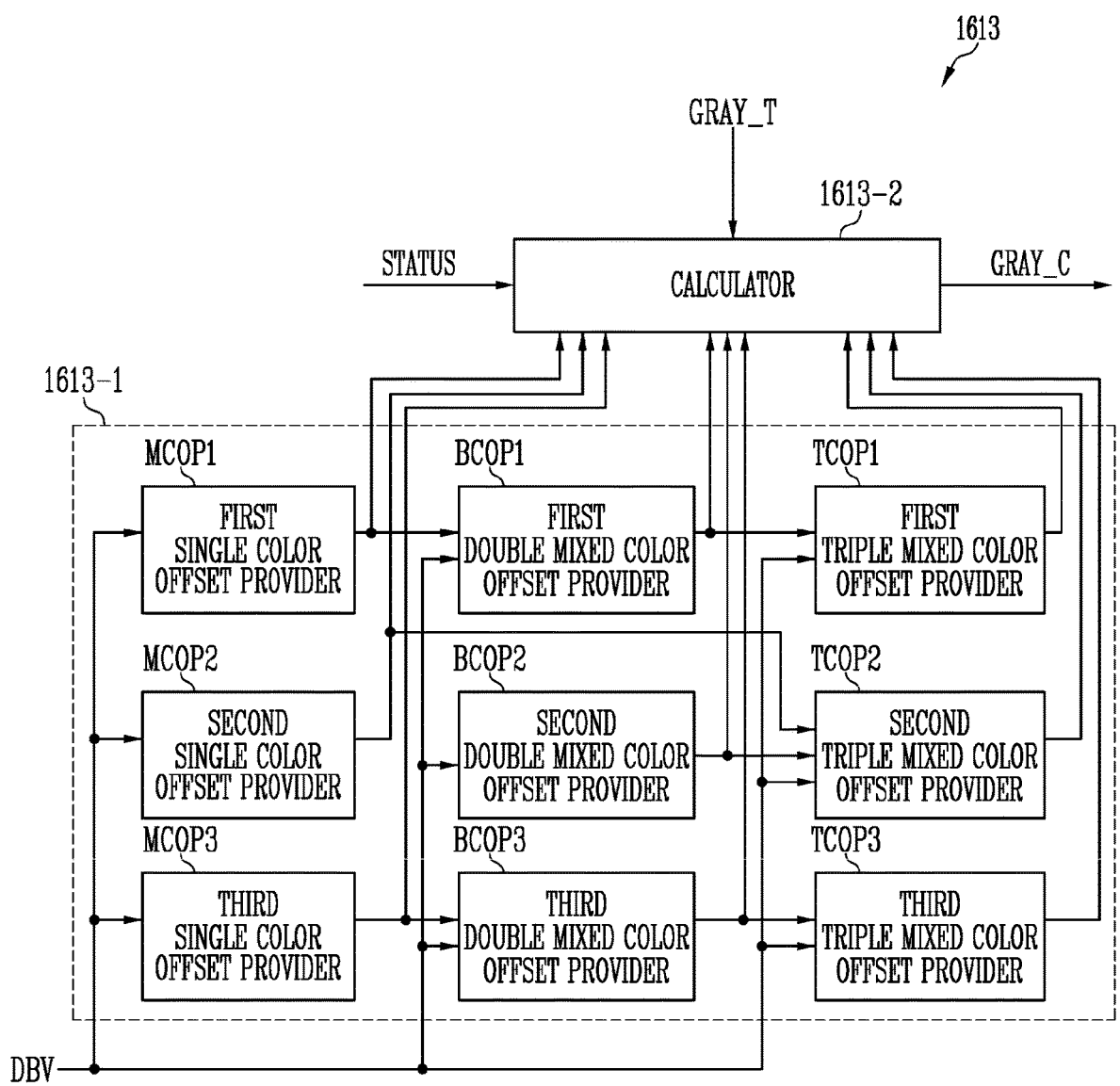
FIG. 16 is a block diagram illustrating an example of an offset setting unit included in the converter shown in FIG. 12.

FIG. 16 is a block diagram illustrating an example of the offset setting unit included in the converter shown in FIG. 12. FIGS. 17 and 18 are diagrams illustrating a single color offset provider included in the offset setting unit shown in FIG. 16.

First, referring to FIGS. 1, 12, and 16, the offset setting unit 1613 may include an offset provider 1613-1 and a calculator 1613-2, and the offset provider 1613-1 may include single color offset providers MCOP1, MCOP2, and MCOP3, double mixed color offset providers BCOP1, BCOP2, and BCOP3, and triple mixed color offset providers TCOP1, TCOP2, and TCOP3.

The offset provider 1613-1 may provide the calculator 1613-2 with offset values corresponding to each of the cases described with reference to FIGS. 13 to 15. The calculator 1613-2 may select one of the offset values, based on the status information STATUS, and generate a corrected grayscale value GRAY_C by correcting an input grayscale value GRAY_T of the target pixel PX_T, using the selected one of the offset values.

A first single color offset provider MCOP1 may provide first single color offset values. The first single offset values may be single color offset values with respect to the first color, and be changed depending on the input maximum luminance value DBV.

Figure 17:
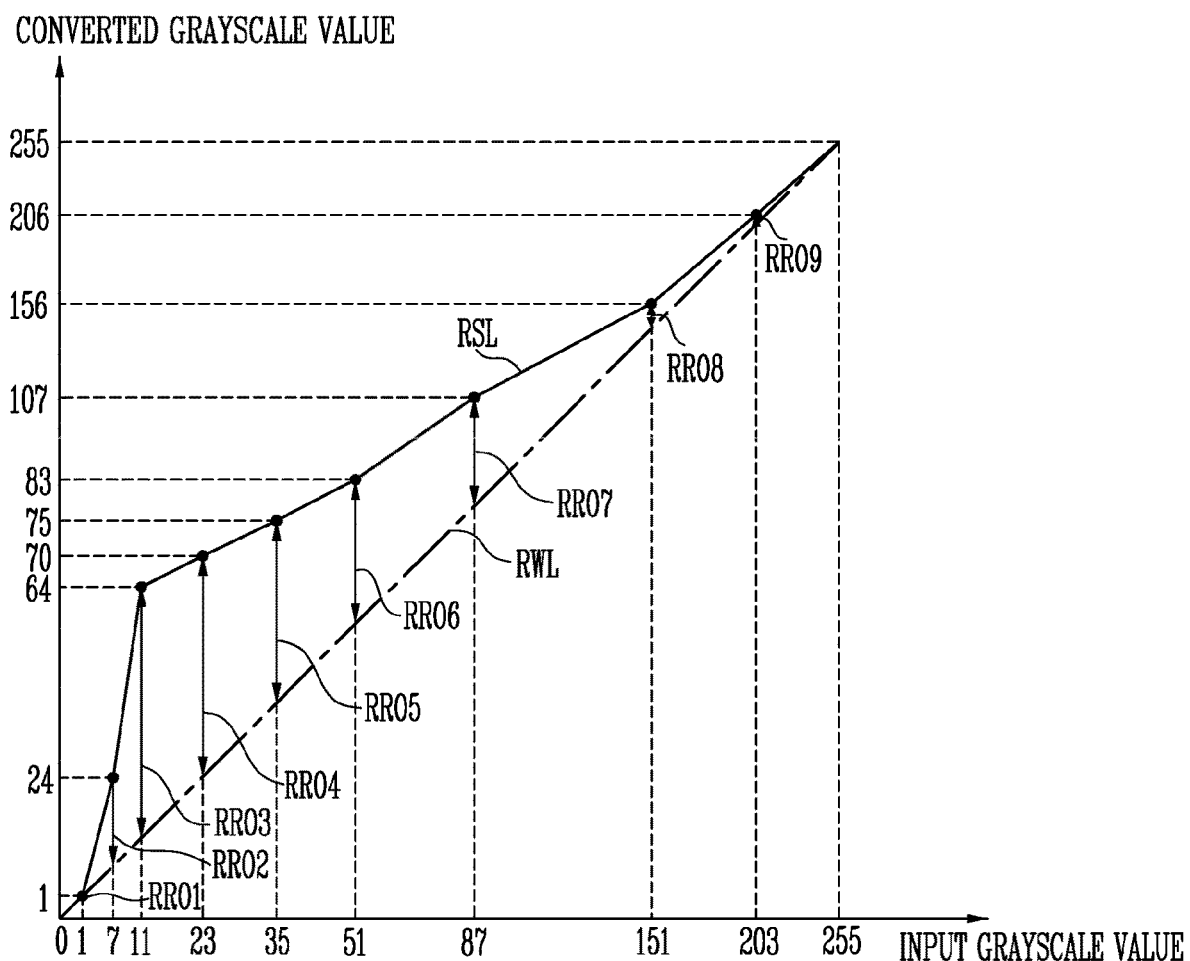
FIGS. 17 and 18 are diagrams illustrating a single color offset provider included in the offset setting unit shown in FIG. 16.
Figure 18:
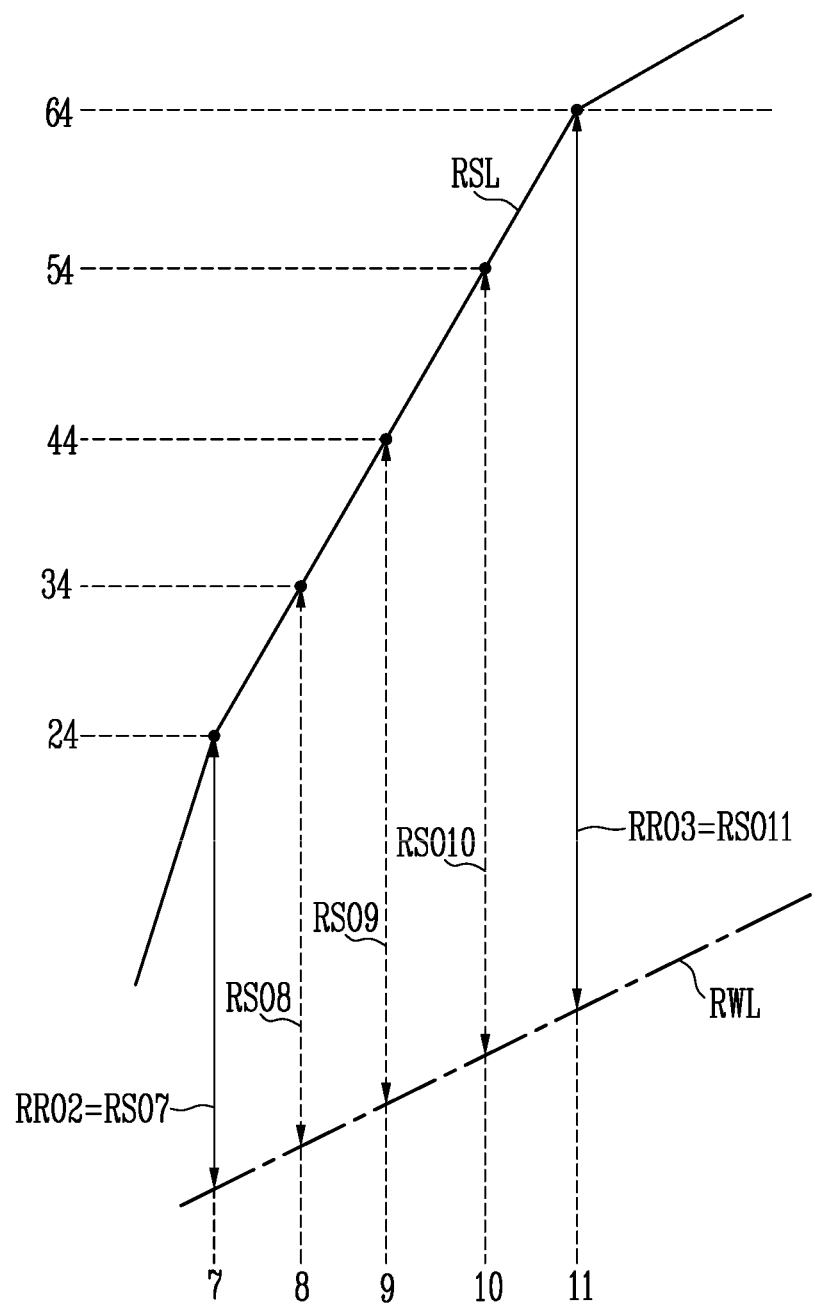

As shown in FIGS. 17 and 18, the first single color offset provider MCOP1 may receive the input maximum luminance value DBV, and select first single color reference offset values RRO1, RRO2, RRO3, RRO4, RRO5, RRO6, RRO7, RRO8, and RRO9 corresponding to the input maximum luminance value DBV. A first single color grayscale line RSL may represent a relationship of corrected grayscale values with respect to input grayscale values.

The first single color offset provider MCOP1 may generate first single color offset values with respect to a total grayscale range by interpolating the first single color reference offset values RRO1, RRO2, RRO3, RRO4, RRO5, RRO6, RRO7, RRO8, and RRO9. The interpolation method may include conventional methods such as linear interpolation, polynomial interpolation, and exponential interpolation.

For example, as shown in FIG. 18, the first single color offset provider MCOP1 may generate a first single color offset value RSO8 corresponding to a grayscale of 8, a first single color offset value RSO9 corresponding to a grayscale of 9, and a first single color offset value RSO10 corresponding to a grayscale of 10 by interpolating a first single color reference offset value RR02 corresponding to a grayscale of 7 and a first single color reference offset value RRO3 corresponding to a grayscale of 11. Because it may be unnecessary for the first single color offset provider MCOP1 to store all first single color offset values, the configuration cost of a memory device can be reduced.

Referring back to FIG. 16, a second single color offset provider MCOP2 may provide second single color offset values. The second single color offset values may be single color offset values with respect to the second color, and be changed depending on the input maximum luminance value DBV.

A third single color offset provider MCOP3 may provide third single color offset values. The third single color offset values may be single color offset values with respect to the third color, and be changed depending on the input maximum luminance value DBV.

A first double mixed color offset provider BCOP1 may provide first double mixed color offset values. With respect to the target pixel PX_T of the first color, the first double mixed color offset values may be double mixed color offset values with respect to a mixed color (e.g., yellow) of the first color and the second color or a mixed color (e.g., magenta) of the first color and the third color.

A second double mixed color offset provider BCOP2 may provide second double mixed color offset values. With respect to the target pixel PX_T of the second color, the second double mixed color offset values may be double mixed color offset values with respect to a mixed color (e.g., yellow) of the second color and the first color or a mixed color (e.g., cyan) of the second color and the third color.

A third double mixed color offset provider BCOP3 may provide third double mixed color offset values. With respect to the target pixel PX_T of the third color, the third double mixed color offset values may be double mixed color offset values with respect to a mixed color (e.g., magenta) of the third color and the first color or a mixed color (e.g., cyan) of the third color and the second color.

A first triple mixed color offset provider TCOP1 may provide first triple mixed color offset values. With respect to the target pixel PX_T of the first color, the first triple mixed color offset values may be triple mixed color offset values with respect to a mixed color of the first color, the second color, and the third color.

A second triple mixed color offset provider TCOP2 may provide second triple mixed color offset values. With respect to the target pixel PX_T of the second color, the second triple mixed color offset values may be triple mixed color offset values with respect to a mixed color of the first color, the second color, and the third color.

A third triple mixed color offset provider TCOP3 may provide third triple mixed color offset values. With respect to the target pixel PX_T of the third color, the third triple mixed color offset values may be triple mixed color offset values with respect to a mixed color of the first color, the second color, and the third color.

Hereinafter, for convenience of description, it is assumed that the target pixel PX_T emits light of the first color. The offset setting unit 1613 may correct an input grayscale value GRAY_T of the target pixel PX_T, based on the status information STATUS of the peripheral pixels PX_ADJ1 and PX_ADJ2 emitting the second color and the third color.

When the status information STATUS includes a light emission number of the second color pixels and a light emission number of the third color pixels, the calculator 1613-2 may generate a corrected grayscale value GRAY_C by correcting the input grayscale value GRAY_T, based on the light emission number of the second color pixels and the light emission number of the third color pixels. For example, the calculator 1613-2 may select one offset value among the first single color offset values, the first double mixed color offset values, and the first triple mixed color offset values, and generate a corrected grayscale value GRAY_C by adding the selected offset value to the input grayscale value GRAY_T.

For example, when the light emission number of the second color pixels among the peripheral pixels PXADJ1 and PX_ADJ2 is 0 and the light emission number of the third color pixels among the peripheral pixels PX_ADJ1 and PX_ADJ2 is 0, the calculator 1613-2 may select a corresponding single color offset value among the first single color offset values, and generate a corrected grayscale value GRAY_C by adding the selected single color offset value to the input grayscale value GRAY_T.

An example will be described with reference to FIG. 17. When the input grayscale value is 1, a corrected grayscale value of 1 may be generated by adding a first single color offset value RSO1 of 0 to the input grayscale value. When the input grayscale value is 7, a corrected grayscale value of 24 may be generated by adding a first single color offset value RS07 of 17 to the input grayscale value. When the input grayscale value is 11, a corrected grayscale value of 64 may be generated by adding a first single color offset value RS011 of 53 to the input grayscale value. When the input grayscale value is 23, a corrected grayscale value of 70 may be generated by adding a first single color offset value RS023 of 47 to the input grayscale value. When the input grayscale value is 35, a corrected grayscale value of 75 may be generated by adding a first single color offset value RS035 of 40 to the input grayscale value. When the input grayscale value is 51, a corrected grayscale value of 83 may be generated by adding a first single color offset value RS051 of 32 to the input grayscale value. When the input grayscale value is 87, a corrected grayscale value of 107 may be generated by adding a first single color offset value RS087 of 20 to the input grayscale value. When the input grayscale value is 151, a corrected grayscale value of 156 may be generated by adding a first single color offset value RS0151 of 5 to the input grayscale value. When the input grayscale value is 203, a corrected grayscale value of 206 may be generated by adding a first single color offset value RS0203 of 3 to the input grayscale value. When the input grayscale value is 255, a corrected grayscale value may be 255. When the input grayscale value is 0, a corrected grayscale value may be 0.

According to some example embodiments, when the light emission number of the second color pixels among the peripheral pixels PX_ADJ1 and PX_ADJ2 is greater than 0 and the light emission number of the third color pixels among the peripheral pixels PX_ADJ1 and PX_ADJ2 is 0, the calculator 1613-2 may select a corresponding double mixed color offset value among the first double mixed color offset values, and generate a corrected grayscale value GRAY_C by adding the selected double mixed color offset value to the input grayscale value GRAY_T.

According to some example embodiments, when the light emission number of the second color pixels among the peripheral pixels PXADJ1 and PX_ADJ2 is greater than 0, the light emission number of the third color pixels among the peripheral pixels PX_ADJ1 and PX_ADJ2 is greater than 0, and the light emission number of the second color pixels is not equal to that of the third color pixels, the calculator 1613-2 may select a corresponding triple mixed color offset value among the first triple mixed color offset values, and generate a corrected grayscale value GRAY_C by adding the selected triple mixed color offset value to the input grayscale value GRAY_T.

According to some example embodiments, when the light emission number of the second color pixels among the peripheral pixels PXADJ1 and PX_ADJ2 is greater than 0, the light emission number of the third color pixels among the peripheral pixels PXADJ1 and PX_ADJ2 is greater than 0, and the light emission number of the second color pixels is equal to that of the third color pixels, the calculator 1613-2 may determine the input grayscale value GRAY_T as a corrected grayscale value GRAY_C. The offset value may be 0.

Referring back to FIGS. 1 and 12, the data output unit 1614 may sequentially output the corrected grayscale value GRAY_C according to a pixel arrangement.

The black voltage converter 162 may set a black grayscale value (or a voltage level of a black voltage) of the peripheral pixels PX_ADJ1 and PX_ADJ2, based on the status information STATUS (e.g., the light emission statuses of the peripheral pixels PX_ADJ1 and PX_ADJ2).

The black voltage converter 162 may include a black voltage offset setting unit 1621, a black voltage leveling unit 1622, a black voltage matching unit 1623, a redundancy processor 1624, and a black voltage output unit 1625 (or black grayscale value output unit).

The black voltage offset setting unit 1621 may determine a black offset value OFFSET_B, based on the input maximum luminance value DBV and the status information STATUS. The black offset value OFFSET_B may represent a voltage value required such that the black offset value OFFSET_B is corrected as a black voltage V_BLACK with respect to a normal black voltage, and the normal black voltage may be a data voltage which is predetermined with respect to when the unit area OA emits white color light and corresponds to the minimum grayscale. According to some example embodiments, the black voltage offset setting unit 1621 may determine a voltage level of the black voltage V_BLACK, based on the black offset value OFFSET_B.

Hereinafter, the normal back voltage will be described with reference to FIG. 19, the black offset value OFFSET_B will be described with reference to FIG. 20, and the black voltage leveling unit 1622 to the black voltage output unit 1625 will be then described.

FIG. 19 illustrates lookup tables representing normal black voltages according to luminances of the pixels included in the display device shown in FIG. 1.

Referring to FIG. 19, a first lookup table B_LUT1 may include information on a first color normal black voltage R_Black of the first color pixel, a second color normal black voltage G_Black of the second color pixel, and a third color normal black voltage B_Black of the third color pixel according to the input maximum luminance DBV.

The display device 10' shown in FIG. 5 may change a luminance of the pixel by controlling an amount of current flowing through the first thin film transistor M1 described with reference to FIG. 6, under a driving condition in which the input maximum luminance value DBV is 100 nits or more. Accordingly, the first color normal black voltage R_Black, the second color normal black voltage G_Black, and the third color normal black voltage B_Black may be set to a constant voltage, under a condition in which the input maximum luminance value DBV is 100 nits or more (e.g., in each of 100 nits, 200 nits, 300 nits, 650 nits, 1000 nits, and 1200 nits). For example, each of the first color normal black voltage R_Black, the second color normal black voltage G_Black, and the third color normal black voltage B_Black may have a voltage level of 6.1 volts.

Also, the display device 10' may change a luminance of the pixel by constantly maintaining an amount of current flowing through the first thin film transistor M1 described with reference to FIG. 6 and controlling a width, (off-duty, or light emission duty) of a pulse of a turn-off level, which belongs to an emission signal (e.g., an emission signal applied to the gate electrode of each of the fifth and sixth thin film transistor M5 and M6), under a condition in which the input maximum luminance value DBV is less than 100 nits. For example, the luminance of the pixel may be lowered as the off-duty of the emission signal increases. That is, the display device 10' may change the luminance of the pixel by using a dimming driving method, under the condition in which the input maximum luminance value DBV is less than 100 nits. Accordingly, a range in which the data voltage is actually used may become smaller than a range of the data voltage under the condition in which the input maximum value DBV is 100 nits or more. Under the condition in which the input maximum luminance value DBV is less than 100 nits, in order to decrease power consumption of the display device 10', corresponding to a decrease in range of the data voltage, the display device 10' may vary at least on of power voltages applied to the first power line ELVDD and the second power line ELVSS, which are shown in FIG. 6, according the input maximum luminance value DBV, and vary the first color normal black voltage R_Black, the second color normal black voltage G_Black, and the third color normal black voltage B_Black according to the input maximum luminance value DV, corresponding to at least one variation among the power voltages. For example, under the condition in which the input maximum luminance value DBV is less than 100 nits, the second color normal black voltage G_Black and the third color normal black voltage B_Black may have a lower voltage level as the input maximum luminance value DBV is lowered.

Referring to the first lookup table B_LUT1, under a condition in which the input maximum luminance value DBV is 60 nits, the second color normal black voltage G_Black and the third color normal black voltage B_Black may have a voltage level of 5.99 volts which is lower by 0.11 volt than 6.1 volts. Under a condition in which the input maximum luminance value DBV is 30 nits, the second color normal black voltage G_Black and the third color normal black voltage B_Black may have a voltage level of 5.84 which is lower by 0.26 volt than 6.1 volts. Under a condition in which the input maximum luminance value DBV is less than 30 nits, the voltage level of the second color normal black voltage G_Black and the third color normal black voltage B_Black is the same as shown in the first lookup table B_LUT1, and therefore, a description of this will be omitted.

However, although the input maximum luminance value DBV is lowered, the first normal black voltage R_Black may have a constant value so as to prevent or reduce a phenomenon in which an image is displayed reddish because a driving current is leaked (e.g., side leakage) to an emitting layer of the first color pixel (e.g., a red pixel) through a PHIL layer as a layer shared by the organic light emitting diodes of the pixels.

However, embodiments according to the present disclosure are not limited thereto. An example will be described with reference to a second lookup table B_LUT2. Under the condition in which the input maximum luminance value DBV is less than 100 nits, the first color normal black voltage R_Black may have a lower voltage level as the input maximum luminance value DBV is lowered. The first color normal black voltage R_Black may have a voltage level equal to that of the second normal black voltage G_Black or the third color normal black voltage B_Black.

In particular, the black voltage converter 162 sets a black voltage of the peripheral pixels PX_ADJ1 and PX_ADJ2, based on the light emission status (e.g., the status information STATUS) of the peripheral pixels PX_ADJ1 and PX_ADJ2, and accordingly, the side leakage can be reduced. Therefore, the black voltage offset setting unit 1621 may use the first color normal black voltage R_Black, the second color normal black voltage G_Black, and the third color normal black voltage B_Black.

Meanwhile, when the black voltage offset setting unit 1621 sets a black voltage of the peripheral pixels PX_ADJ1 and PX_ADJ2 by using the second lookup table B_LUT2, the set black voltage may have a voltage level (e.g., an optimized voltage level) relatively lower than that of the black voltage in the first lookup table B_LUT1. Accordingly, a change in characteristic of the driving transistor in the pixel (e.g., as a hysteresis characteristic, a characteristic in which a threshold voltage of the driving transistor is further shifted when a relatively high black voltage is applied) and an instantaneous afterimage caused by the change in characteristic can be reduced.

FIG. 20 illustrates a lookup table representing black offsets of pixels according to a display color in the unit area included in the display device shown in FIG. 1.

Referring to FIGS. 1 and 20, when the unit area OA displays a single color (or primary color) and a double mixed color (or secondary color), a third lookup table LUT3 may include black offset values of the peripheral pixels PX_ADJ1 and PX_ADJ2 according to the input maximum luminance value DBV. The black offset values may be set or predetermined through multi-time programming (MTP), and be pre-stored in a memory device, etc. In addition, similarly to the offset values described with reference to FIG. 16, only black offset values with respect to some maximum luminance values (e.g., reference maximum luminance values) may be pre-stored, and black offset values with respect to the other maximum luminance values may be generated through interpolation of the pre-stored black offset values.

First, a case where the unit area OA displays the first color is assumed. For example, the fifty-first case R1_GOBO described with reference to FIG. 13 is assumed.

Black offset values with respect to the second color black voltage G_Black of the second color pixel may be set to have a value greater than 0.

For example, when the input maximum luminance value DBV is 100 nits, the black offset value with respect to the second color black voltage G_Black may be 0.06 (volt). The black offset value with respect to the second color black voltage G_Black may be increased as the input maximum luminance value DBV becomes greater than 100 nits. For example, when the input maximum luminance value DBV is 1200 nits, the black offset value with respect to the second color black voltage G_Black may be 0.08 (volt). The black offset value with respect to the second color black voltage G_Black may be increased as the input maximum luminance value DBV becomes smaller than 100 nits. For example, when the input maximum luminance value DBV is 4 nits, the black offset value with respect to the second color black voltage G_Black may be 0.35 (volt).

Meanwhile, black offset values with respect to the third color black voltage B_Black of the third color pixel may be about 0 (volt). As described with reference to FIG. 11, the third color luminance curve BWC with respect to light of the third color may have a shape similar to that of a desired gamma curve, and influence on side leakage hardly exists when the third color pixel does not emit light. Therefore, the black offset values with respect to the third color black voltage B_Black may be about 0 (volt).

Next, a case where the unit area OA displays the second color is assumed. For example, the thirty-first case G1_B0R0 described with reference to FIG. 14 is assumed.

Black offset values with respect to the first color black voltage R_Black of the first color pixel may be set to have a value greater than 0.

For example, when the input maximum luminance value DBV is 100 nits, the black offset value with respect to the first color black voltage R_Black may be 0.11 (volt). The black offset value with respect to the first color black voltage R_Black may be increased as the input maximum luminance value DBV becomes greater than 100 nits. For example, when the input maximum luminance value DBV is 1200 nits, the black offset value with respect to the first color black voltage R_Black may be 0.15 (volt). The black offset value with respect to the first color black voltage R_Black may be increased as the input maximum luminance value DBV becomes smaller than 100 nits. For example, when the input maximum luminance value DBV is 4 nits, the black offset value with respect to the first color black voltage R_Black may be 0.70 (volt).

The first color luminance curve RWC with respect to light of the first color, which is described with reference to FIG. 11, may have a gamma value greater than that of the second color luminance curve GWC, and influence on side leakage of the first color pixel may be greater than that on side leakage of the second color pixel. Accordingly, under a condition in which the input maximum luminance value DBV is the same, the black offset value with respect to the first color black voltage R_Black may be set greater than that of the second color black voltage G_Black.

Meanwhile, black offset values with respect to the third color black voltage B_Black of the third pixel may be about 0 (volt).

Next, a case where the unit area OA displays the third color is assumed. For example, the fifty-first case B1_R0G0 described with reference to FIG. 15 is assumed.

The black offset values with respect to the first black voltage R_Black of the first color pixel and the black offset values with respect to the second color black voltage G_Black of the second color pixel may be about 0 (volt). This is because side leakage between the third color pixel and the first and second color pixels hardly occurs.

Next, a case where the unit area OA displays the first double mixed color (e.g., cyan) is assumed. For example, one of the eleventh case G1_B2R0 and the twenty-first case G1_B1R0, which are described with reference to FIG. 14, and the eleventh case B1_R0G4, the twenty-first case B1_R0G3, the thirty-first case B1_R0G2, and the forty-first case B1_R0G1, which are described with reference to FIG. 15, is assumed.

Only the first color pixel among the peripheral pixels PXADJ1 and PX_ADJ2 does not emit light, and the black offset values with respect to the first color black voltage R_Black of the first color pixel may be set greater than 0.

For example, the black offset values with respect to the first color black voltage R_Black of the first color pixel may be equal to those with respect to the first color black voltage R_Black when the unit area OA displays the second color. However, embodiments according to the present disclosure are not limited thereto, and the black offset values with respect to the first color black voltage R_Black of the first color pixel when the unit area OA displays the first double mixed color (e.g., cyan) may be set different from those with respect to the first color black voltage R_Black when the unit area OA displays the second color.

Next, a case where the unit area OA displays the second double mixed color (e.g., magenta) is assumed. For example, one of the eleventh case R1_G0B4, the twenty-first case R1_G0B3, the thirty-first case R1_G0B2, and the forty-first case R1_G0B1, which are described with reference to FIG. 13, and the fifty-second case B1_R1G0, the fifty-third case B1_R2G0, the fifty-fourth case B1_R3G0, and the fifty-fifth case B1_R4G0, which are described in FIG. 15, is assumed.

Only the second color pixel among the peripheral pixels PX_ADJ1 and PX_ADJ2 does not emit light, and the black offset values with respect to the second color black voltage G_Black of the second color pixel may be set greater than 0.

For example, the black offset values with respect to the second color black voltage G_Black of the second color pixel may be equal to that with respect to the second color black voltage G_Black when the unit area OA displays the first color. However, embodiments according to the present disclosure are not limited thereto, and the black offset values with respect to the second color black voltage G_Black of the second color pixel when the unit area OA displays the second double mixed color (e.g., magenta) may be set different from those with respect to the second color black voltage G_Black when the unit area OA displays the first color.

Next, a case where the unit area OA displays the third double mixed color (e.g., yellow) is assumed. For example, one of the fifty-second case R1_G1B0, the fifty-third case R1_G2B0, and the fifty-fourth case R1_G3B0, which are described with reference to FIG. 13, and the thirty-second case G1_B0R1 and the twenty-third case G1-B1R2, which are described with reference to FIG. 14, is assumed.

Only the third color pixel among the peripheral pixels PX_ADJ1 and PX_ADJ2 does not emit light, and the black offset values with respect to the third color black voltage B_Black of the third color pixel may be about 0.

Meanwhile, a case where the unit area OA displays a triple mixed color or white color is assumed.

The black offset values with respect to the first color black voltage R_Black of the first color pixel, the black offset values with respect to the second color black voltage G_Black of the second color pixel, and the black offset values with respect to the third color black voltage B_Black of the third color pixel may be 0.

As described with reference to FIGS. 19 and 20, black offset values may be determined according to the light emission statuses of the peripheral pixels PX_ADJ1 and PX_ADJ2.

Meanwhile, a configuration for generating the black voltage V_BLACK by individually adding the black offset value OFFSET_B (see FIG. 12) of each of the pixels to a normal black voltage (e.g., a general data voltage corresponding to the minimum grayscale) after the normal black voltage is generated may be very complicated.

Therefore, the black voltage converter 162 may generate black grayscale values corresponding to the black offset value OFFSET_B (or the black voltage V_BLACK), and the data driver 12 may generate the black voltage V_BLACK by selecting one of the reference black voltages RV0_1 to RV0_256, GV0_1 to GV0_256, and BV0_1 to BV0_256 (see FIG. 1), based on the black grayscale value.

Referring back to FIG. 12, the black voltage offset setting unit 1621 may determine the black offset value OFFSET_B (or a voltage level of the black voltage V_BLACK (see FIG. 23)) by using the second lookup table B_LUT2 described with reference to FIG. 19 and the third lookup table B_LUT3 described with reference to FIG. 20.

The black voltage leveling unit 1622 may generate black grayscale values corresponding to the reference black voltages RV0_1 to RV0_256, GV0_1 to GV0_256, and BV0_1 to BV0_265 (see FIG. 1), and the black voltage matching unit 1623 may select one of the black grayscale values, based on the black offset value OFFSET_B (or the black voltage V_BLACK) set in the black voltage offset setting unit 1621.

According to some example embodiments, the black voltage leveling unit 1622 may determine voltage levels of the first reference black voltages RV0_1 to RV0_265, based on the first reference voltage VH (see FIG. 9) and the 0th reference gamma voltage RV0 (see FIG. 9), which are used in the voltage generator 15 (see FIG. 1). For example, the black voltage leveling unit 1622 may determine the voltage levels of the first reference black voltages RV0_1 to RV0_265 by interpolating the first reference voltage VH (see FIG. 9) and the 0th reference gamma voltage RV0 (see FIG. 9). Also, the black voltage leveling unit 1622 may generate a lookup table representing a relationship between the voltage levels of the first reference black voltages RV0_1 to RV0_265 and black grayscale values BV.

In a similar manner, the black voltage leveling unit 1622 may determine each of voltage levels of the second reference black voltages GV0_1 to GV0_256 and voltage levels of the third reference black voltages BV0_1 to BV0_256, and generate a lookup table including the voltage levels of the second reference black voltages GV0_1 to GV0_256 and the voltage levels of the third reference black voltages BV0_1 to BV0_256.

According to some example embodiments, the black voltage leveling unit 1622 may receive information on the first reference black voltages RV0_1 to RV0_256 from the voltage generator 15 (see FIG. 1), and generate black grayscale values BV (or a lookup table including the black grayscale values), based on the information on the first reference black voltages RV0_1 to RV0_256.

The black grayscale values BV will be described with reference to FIG. 21.

FIG. 21 is a diagram illustrating an example of the lookup table generated in the black voltage leveling unit included in the converter shown in FIG. 12.

Referring to FIGS. 12 and 21, a fourth lookup table B_LUT4 may include a voltage level value of each of the first reference black voltages RV0_1 to RV0_256. A voltage level of a first reference black voltage RV0_1 may be equal to the first reference voltage VH, and a voltage level of a 256th reference black voltage RV0_256 may be equal to the 0th reference gamma voltage RV0. A voltage level of a second reference black voltage RV0_2 may be equal to a voltage obtained by subtracting 1/255 of the difference between the first reference voltage VH and the 0th reference gamma voltage RV0 from the first reference voltage VH. Similarly, a voltage level of a third reference black voltage RV0_3 may be equal to a voltage obtained by subtracting 2/255 of the difference between the first reference voltage VH and the 0th reference gamma voltage RV0 from the first reference voltage VH.

That is, the first to 256th reference black voltages RV0_1 to RV0_256 may be expressed as shown in the following Equation 2.

$$RV0\_i = VH - (VH - RV0) \times (i-1)/255 \qquad \text{Equation 2}$$

Here, RV0_i is an ith reference black voltage, VH is a first reference voltage VH, and RV0 is a 0th reference gamma voltage.

The black voltage matching unit 1623 may select a black grayscale value GRAY_B matched to the black offset value OFFSET_B (or the black voltage V_BLACK) set in the black voltage offset setting unit 1621.

When different black grayscale values (or black voltages) are set in peripheral pixels located in a plurality of unit areas, the redundancy processor 1624 may select one of the different black grayscale values, or generate a corrected black grayscale value GRAY_B_C by averaging the black grayscale values.

An operation of the redundancy processor 1624 will be described with reference to FIG. 22.

Figure 22:
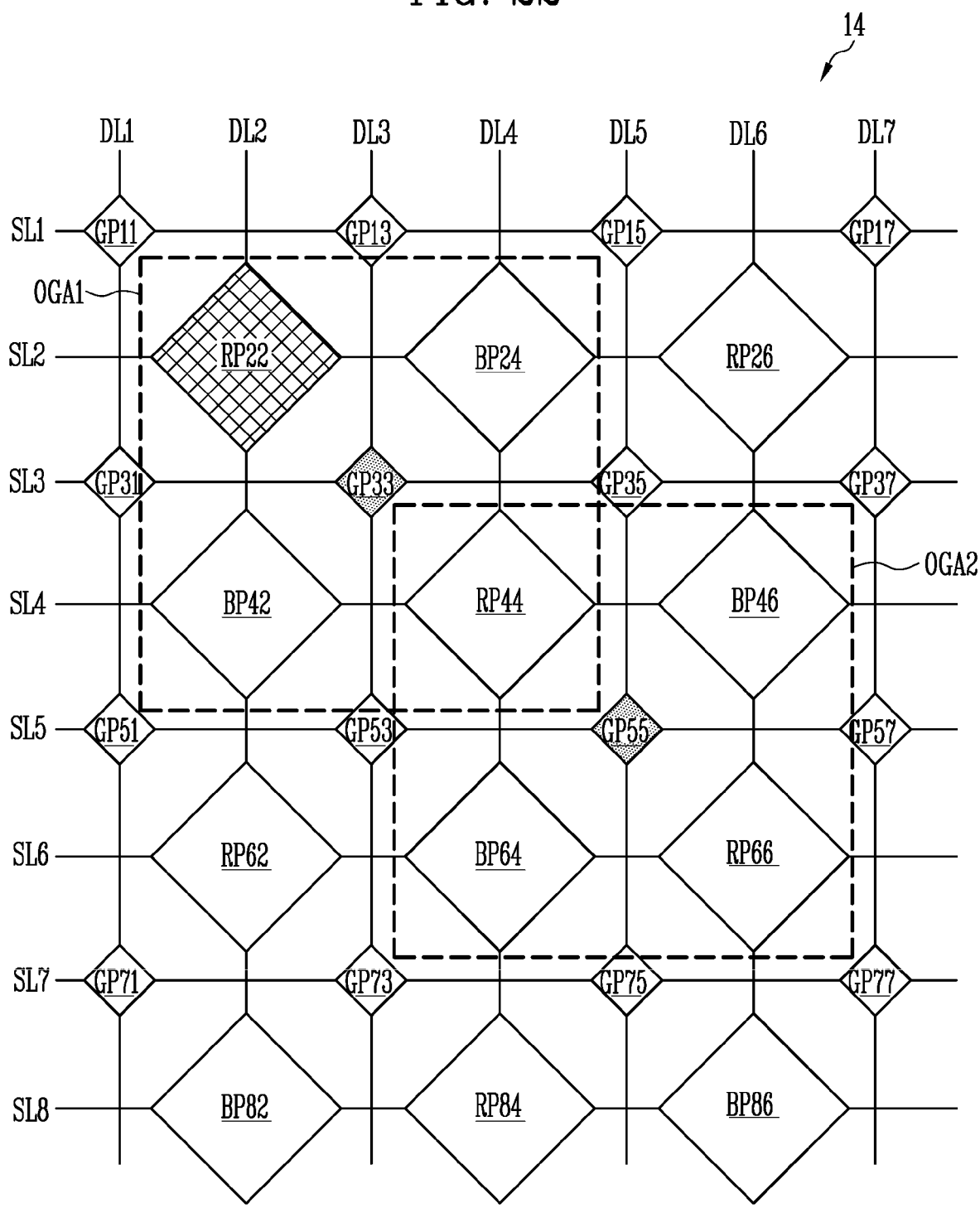
FIG. 22 is a diagram illustrating an operation of a redundancy processor included in the converter shown in FIG. 12.

FIG. 22 is a diagram illustrating an operation of the redundancy processor included in the converter shown in FIG. 12. The pixel unit 14 corresponding to FIG. 2 is illustrated as an example in FIG. 22.

A fourth unit area OGA1 may be set with respect to the thirty-third pixel GP33, and include the forty-fourth pixel RP44 as a peripheral pixel. A fifth unit area OGA2 may be set with respect to the fifty-fifth pixel GP55, and include the forty-fourth pixel RP44 as a peripheral pixel. Hereinafter, it is assumed that only the twenty-second pixel RP22, the thirty-third pixel GP33, and the fifty-fifth pixel GP55 emit light in the fourth unit area OGA1 and the fifth unit area OGA2.

The fourth unit area OGA1 may correspond to the thirty-second case G1_B0R1 described with reference to FIG. 14, and display a double mixed color of yellow. The black voltage offset setting unit 1621 may not separately set a first black offset value of the forty-fourth pixel RP44 (e.g., the forty-fourth pixel RP44 which does not emit light), based on the third lookup table B_LUT3 shown in FIG. 20. For example, the first black offset value of the forty-fourth pixel RP44 may be 0.

Meanwhile, the fifth unit area OGA2 may correspond to the thirty-first case G1_B0R0 described with reference to FIG. 14, and display a single color (e.g., green). The black voltage offset setting unit 1621 may set the first black offset value of the forty-fourth pixel RP44 (e.g., the forty-fourth pixel RP44 which does not emit light) to be greater than 0, based on the third lookup table B_LUT3 shown in FIG. 20.

Accordingly, the first black offset value (e.g., a value of 0) of the forty-fourth pixel RP44, which is set with respect to the fourth unit area OGA1, and a first black grayscale value (and a black voltage) corresponding thereto may be respectively different from the first black offset value (e.g., a value greater than 0) of the forty-fourth pixel RP44, which is set with respect to the fifth unit area OGA2, and a second black grayscale value (and a black voltage) corresponding thereto.

The redundancy processor 1624 may select one of the first black grayscale value and the second black grayscale value, or generate a corrected black grayscale value GRAY_B_C by averaging the first black grayscale value and the second black grayscale value.

According to some example embodiments, the redundancy processor 1624 may generate the corrected black grayscale value GRAY_B_C by selecting a largest value from the first black grayscale value and the second black grayscale value. According to some example embodiments, the redundancy processor 1624 may generate the corrected black grayscale value GRAY_B_C by selecting a smallest value from the first black grayscale value and the second black grayscale value. According to some example embodiments, the redundancy processor 1624 may generate the corrected black grayscale value GRAY_B_C by averaging the first black grayscale value and the second black grayscale value.

Referring back to FIG. 12, the black voltage output unit 1625 may sequentially output the corrected black grayscale value GRAY_B_C according to a pixel arrangement.

According to some example embodiments, the black voltage output unit 1625 may simultaneously (or concurrently) output a black grayscale value GRAY_B_C of a specific pixel, corresponding to a corrected grayscale value GRAY_C of the specific pixel. That is, because the corrected grayscale value GRAY_C of the specific pixel, which is generated at a time at which the specific pixel is selected as a target pixel, and the black grayscale value GRAY_B_C of the specific pixel, which is generated at several times at which the specific pixel is selected as a peripheral pixel, are generated at different times, the data output unit 1614 and the black voltage output unit 1625 may output the corrected grayscale value GRAY_C and the black grayscale value GRAY_B_C of the specific pixel at the same time.

According to some example embodiments, the black voltage output unit 1625 (or the timing controller 11) may generate one converted grayscale value including a corrected grayscale value GRAY_C and a black grayscale value GRAY_B_C. The converted grayscale value may be provided to the data driver 12.

For example, when each of the corrected grayscale value GRAY_C and the black grayscale value GRAY_B_C is expressed with 8 bits, the converted grayscale value may be expressed with 9 bits. When the most significant bit of the converted grayscale value is 1, the converted grayscale value may represent the corrected grayscale value GRAY_C. When the most significant bit of the converted grayscale value is 0, the converted grayscale value may represent the black grayscale value GRAY_B_C.

As described with FIGS. 12 to 20, the converter 16 may generate a corrected grayscale value (e.g., a corrected grayscale value for a corrected data voltage) by correcting an input grayscale value a target pixel, based on light emission statuses of the peripheral pixels, and generate a black grayscale value (e.g., a black grayscale value for adjusting a black voltage corresponding to the minimum grayscale) of peripheral pixels (particularly, the peripheral pixels which do not emit light), based on the light emission statuses of the peripheral pixels. Accordingly, when single color light and mixed color light in addition to white color light are emitted from the pixels, an image having a desired luminance and a desired color coordinate can be displayed.

FIG. 23 illustrates a lookup table representing black voltages finally set by the converter shown in FIG. 12.

Referring to FIGS. 1, 12, 19, 20, and 23, when the unit area OA displays a single color (or primary color), a double mixed color (or secondary color), and another color (e.g., a triple mixed color or white color) (or general black) except the single color and the double mixed color, a fifth lookup table B_LUT5 may include black voltages of the peripheral pixels PX_ADJ1 and PX_ADJ2 according to the input maximum luminance value DBV.

The black voltages R_Black, G_Black, and B_Black included in the fifth lookup table B_LUT5 may be equal to those obtained by adding the black offset values described with reference to FIG. 20 to the black voltages R_Black, G_Black, and B_Black of the second lookup table B_LUT2 described with reference to FIG. 19. Therefore, a description of each of the black voltages R_Black, G_Black, and B_Black will be omitted.

FIG. 24 is a flowchart illustrating a method of driving a display device according to some example embodiments of the present disclosure.

Referring to FIGS. 1, 5, 12, and 24, the method shown in FIG. 24 may be performed in the display device 10 shown in FIG. 1 and/or the display device 10' shown in FIG. 5.

The method shown in FIG. 24 may receive an input grayscale value corresponding to the target pixel PX_T and an observation grayscale value corresponding to the peripheral pixels PX_ADJ1 and PX_ADJ2 (S2410).

As described with reference to FIG. 12, the data input unit 1611 may receive grayscale values GRAY (or input image data), and extract grayscale values, e.g., observation grayscale values GRAY_ADJ of the peripheral pixels PX_ADJ1 and PX_ADJ2 in the unit area OA.

Subsequently, the method shown in FIG. 24 may determine light emission statuses of the peripheral pixels PX_ADJ1 and PX_ADJ2, based on the observation value.

According to some example embodiments, the method shown in FIG. 24 may calculate a light emitting pixel number of the peripheral pixels PX_ADJ1 and PX_ADJ2 by counting a number of observation grayscale values greater than a reference grayscale value (S2420).

As described with reference to FIGS. 12 to 15, the peripheral pixel status observing unit 1612 may calculate each of a first light emitting pixel number of the first color pixels, a second light emitting pixel number of the second color pixels, and a third light emitting pixel number of the third color pixels for each unit area.

Subsequently, the method shown in FIG. 24 may correct the input grayscale value of the target pixel PX_T, based on the light emitting pixel number (S2430).

As described with reference to FIGS. 12 and 16 to 18, the offset setting unit 1613 may select one of offset values (e.g., set or predetermined offset values), based on the light emitting pixel number, and generate a corrected grayscale value GRAY_C by adding the selected offset value to an input grayscale value GRAY_T.

Subsequently, the method shown in FIG. 24 may determine a black grayscale value, (black offset value, or black voltage) of the peripheral pixels PX_ADJ1 and PX_ADJ2, based on the light emitting pixel number (S2440).

As described with reference to FIGS. 12 and 19 to 21, the black voltage offset setting unit 1621 may determine a black offset value OFFSET_B, based on an input maximum luminance value DBV and the light emitting pixel number (e.g., status information STATUS), the black voltage leveling unit 1622 may generate black grayscale values corresponding to reference black voltages RV0_1 to RV0_256, GV0_1 to GV0_256, and BV0_1 to BV0_256, and the black voltage matching unit 1623 may select one black grayscale value among black grayscale values matched to the black offset value OFFSET_B set in the black voltage offset setting unit 1621.

According to some example embodiments, when different black grayscale values (or black voltages) are set in one peripheral pixel located in a plurality of unit area, the method shown in FIG. 24 may select one of the different black grayscale values, or generate a corrected black grayscale value GRAY_B_C by averaging the black grayscale values.

As described with reference to FIG. 22, the pixel unit 14 may include the fourth unit area OGA1 and the fifth unit area OGA2, and the forty-fourth pixel RP44 which does not emit light may be located in each of the fourth unit area OGA1 and the fifth unit area OGA2. The method shown in FIG. 24 may set a first black voltage (or first black grayscale value) of the forty-fourth pixel RP44 with respect to the fourth unit area OGA1, and set a second black voltage (or second black grayscale value) of the forty-fourth pixel RP44 with respect to the fifth unit area OGA2. When the first black voltage and the second black voltage are different from each other, the method shown in FIG. 24 may select one of the first black voltage and the second black voltage, or output a corrected black voltage (or corrected black grayscale value) by averaging the first black voltage and the second black voltage.

Subsequently, the method shown in FIG. 24 may provide the target pixel PX_T with a data voltage corresponding to the corrected input grayscale value, and apply a black voltage corresponding to the black grayscale value (or corrected black grayscale value) to a peripheral pixel which does not emit light among the peripheral pixels PX_ADJ1 and PX_ADJ2 (S2450).

As described with reference to FIG. 24, the method corrects the input grayscale value of the target pixel PX_T, based on the light emission statuses of the peripheral pixels PX_ADJ1 and PX_ADJ2, and variably sets the black voltage of the peripheral pixels PX_ADJ1 and PX_ADJ2. Thus, side leakage can be prevented or reduced, and a desired luminance can be exhibited even when the display device 10 displays an image of single color light and mixed color lights.

In the display device and the method of driving the same in accordance with the present disclosure, an input grayscale value is corrected based on light emission statuses of peripheral pixels in a unit area set with respect to a target pixel, and a black voltage of the peripheral pixels (e.g., a data voltage provided to a pixel which does not emit light) may be varied. Thus, side leakage can be prevented or reduced, and a desired luminance can be exhibited even when the unit area (or pixels) emits single color light and mixed color lights.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims and their equivalents.

What is claimed is:

1. A display device comprising:
a pixel unit including a target pixel and peripheral pixels in a unit area set based on the target pixel;
a converter configured to adjust a voltage level of a data voltage of the target pixel, based on light emission statuses of the peripheral pixels, and to adjust a voltage level of a black voltage of at least one peripheral pixel which does not emit light among the peripheral pixels, based on the light emission statuses of the peripheral pixels; and
a data driver configured to apply the data voltage to the target pixel, and to apply the black voltage to the at least one peripheral pixel which does not emit light.

2. The display device of claim 1, wherein the target pixel is a first color pixel configured to emit light of a first color, and
wherein the peripheral pixels include second color pixels configured to emit light of a second color and third color pixels configured to emit light of a third color.

3. The display device of claim 2, wherein the first color is one of red and green colors, the second color is another of the red and green colors, and the third color is a blue color, and
wherein, under a condition in which a luminance of the unit area is constant, the converter is configured to vary a voltage level of a black voltage of the second color pixels, based on the light emission statuses, and to maintain a voltage level of a black voltage of the third color pixels constant.

4. The display device of claim 2, wherein the unit area is an area within a first radius with respect to the target pixel, and
wherein the first radius corresponds to a distance between the target pixel and a first color pixel most adjacent to the target pixel.

5. The display device of claim 2, wherein the converter is configured to:
set the black voltage of the second color pixels to have a first voltage level, in response to a determination that at least one of the second color pixels emits light; and
set the black voltage to have a second voltage level, in response to a determination that all the second color pixels do not emit light.

6. The display device of claim 5, wherein each of the target pixel and the peripheral pixels includes a light emitting element and a driving transistor configured to control an amount of driving current flowing through the light emitting element in response to the data voltage,
wherein the driving transistor is implemented with a P-type transistor, and
wherein the second voltage level is higher than the first voltage level.

7. The display device of claim 1, wherein the converter includes:
a grayscale converter configured to determine the light emission statuses of the peripheral pixels, based on adjacent grayscale values of the peripheral pixels, and to generate a corrected grayscale value by correcting an input grayscale value of the target pixel, based on the light emission statuses of the peripheral pixels; and
a black voltage converter configured to set a black grayscale value representing the voltage level of the black voltage, based on the light emission statuses of the peripheral pixels.

8. The display device of claim 7, further comprising a voltage generator configured to generate reference gamma voltages and reference black voltages, wherein the data driver is configured to:
select one of the reference gamma voltages, based on the corrected grayscale value, and outputs, as the data voltage, the one selected among the reference gamma voltages; and
select one of the reference black voltages, based on the black grayscale value, and outputs, as the black voltage, the one selected among the reference black voltages.

9. The display device of claim 8, wherein the grayscale converter is configured to determine a color displayed in the unit area, based on the light emission statuses of the peripheral pixels, as one of a single color, a double mixed color, and a triple mixed color, and
wherein the black voltage converter is configured to, in response to the color in the unit area is a single color or a double mixed color, determine a black offset value of the at least one peripheral pixel and calculate the black grayscale value, based on the black offset value.

10. The display device of claim 9, wherein the black voltage converter includes:
a black voltage offset setting unit configured to determine the black offset value corresponding to the light emission statuses by using a first lookup table;
a black voltage leveling unit configured to generate black grayscale values respectively corresponding to the reference black voltages; and
a black voltage matching unit configured to select the black grayscale value corresponding to the black offset value among the black grayscale values.

11. The display device of claim 10, wherein the black voltage converter is configured to vary the black offset value depending on a luminance of the unit area.

12. The display device of claim 10, wherein the target pixel is configured to emit light of a red color,
wherein the peripheral pixels include green color pixels configured to emit light of the green color and blue color pixels configured to emit light of the blue color, and
wherein, in response to the green color pixels not emitting light, the black voltage offset setting unit is configured to set a black offset value of the green color pixels to be greater than 0.

13. The display device of claim 12, wherein the black voltage offset setting unit is configured to set a black offset value of the blue color pixels to be 0.

14. The display device of claim 10, wherein the target pixel is configured to emit light of a blue color,
wherein the peripheral pixels include red color pixels configured to emit light of the red color and blue color pixels configured to emit light of the blue color, and
wherein, in response to the red pixels not emitting light, the black voltage offset setting unit is configured to a black offset value of the red color pixels to be greater than 0.

15. The display device of claim 10, wherein the pixel unit includes a first unit area and a second unit area,
wherein the at least one peripheral pixel is located in each of the first unit area and the second unit area, and
wherein the black voltage converter further includes a redundancy processor configured to select one of a first black voltage set with respect to the at least one peripheral pixel in the first unit area and a second black voltage set with respect to the at least one peripheral pixel in the second unit area or average the first black voltage and the second black voltage, in response to the first black voltage and the second black voltage being different from each other.

16. The display device of claim 9, wherein the grayscale converter is configured to calculate a pixel number of peripheral pixels emitting light among the peripheral pixels, to determine an offset value, based on the color and the pixel number, and to calculate the corrected grayscale value by adding the offset value to the input grayscale value.

17. A display device comprising:
a pixel unit including a first color pixel configured to emit light of a first color and second color pixels which are located in a unit area set based on the first color pixel and configured to emit light of a second color;
a converter configured to adjust a voltage level of a data voltage of the first color pixel, based on light emission statuses of the second color pixels, to set a black voltage of the second color pixels to have a first voltage level when at least one of the second color pixels emits light, and to set the black voltage to have a second voltage level when the second color pixels do not emit light; and
a data driver configured to apply the black voltage to the second color pixels.

18. The display device of claim 17, wherein the first color is one of red and green colors, and the second color is another of the red and green colors.

19. The display device of claim 18, wherein each of the first color pixel and the second color pixels includes a light emitting element and a driving transistor configured to control an amount of driving current flowing through the light emitting element in response to the data voltage,
wherein the driving transistor is implemented with a P-type transistor, and
wherein the second voltage level is higher than the first voltage level.

20. A method of driving a display device including a target pixel and peripheral pixels located in a unit area set based on the target pixel, the method comprising:
receiving an input grayscale value corresponding to the target pixel and observation grayscale values corresponding to the peripheral pixels;
calculating a light emitting pixel number of the peripheral pixels by counting a number of observation grayscale values, which exceeds a reference grayscale value;
determining a black voltage of the peripheral pixels, based on the light emitting pixel number; and
applying the black voltage to a peripheral pixel which does not emit light among the peripheral pixels,
wherein an observation grayscale value of the peripheral pixel which does not emit light corresponds to a minimum grayscale within a grayscale range of the input grayscale value.

21. The method of claim 20, wherein the target pixel is a first color pixel configured to emit light of a first color,
wherein the peripheral pixels include second color pixels configured to emit light of a second color and third color pixels configured to emit light of a third color, and
wherein the calculating the light emitting pixel number includes:
calculating a first light emitting pixel number of the second color pixels; and
calculating a second light emitting pixel number of the third color pixels.

22. The method of claim 21, wherein the first color is one of red and green colors, the second color is another of the red and green colors, and the third color is a blue color, and wherein the determining of the black voltage includes variably setting a voltage level of a black voltage of the second color pixels, based on the first light emitting pixel number, under a condition in which a luminance of the unit area is constant.

23. The method of claim 20, wherein the determining of the black voltage includes setting a black grayscale value of the peripheral pixels, based on the light emitting pixel number, and
wherein the applying of the black voltage includes selecting one of predetermined black voltages, based on the black grayscale value, and applying the selected black voltage to the peripheral pixel which does not emit light.

24. The method of claim 20, wherein the display device includes a first unit area and a second unit area,
wherein the peripheral pixel which does not emit light is located in each of the first unit area and the second unit area, and
wherein the determining of the black voltage includes:
setting a first black voltage of the peripheral pixel which does not emit light with respect to the first unit area;
setting a second black voltage of the peripheral pixel which does not emit light with respect to the second unit area; and
selecting one of the first black voltage and the second black voltage or averaging the first black voltage and the second black voltage, when the first black voltage and the second black voltage are different from each other.

* * * * *